(12) United States Patent
Suzuki et al.

(10) Patent No.: US 11,949,338 B2
(45) Date of Patent: Apr. 2, 2024

(54) POWER CONVERTER

(71) Applicant: FUJI ELECTRIC CO., LTD., Kanagawa (JP)

(72) Inventors: Yuji Suzuki, Tokyo (JP); Motohito Hori, Nagano (JP); Akio Toba, Tokyo (JP); Ikuya Sato, Kanagawa (JP); Yasuhito Tanaka, Kanagawa (JP); Masamichi Iwasaki, Tokyo (JP); Masaaki Ajima, Tokyo (JP); Nobuaki Ohguri, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 235 days.

(21) Appl. No.: 17/652,162

(22) Filed: Feb. 23, 2022

(65) Prior Publication Data

US 2022/0181981 A1    Jun. 9, 2022

Related U.S. Application Data

(63) Continuation of application No. PCT/JP2021/006510, filed on Feb. 19, 2021.

(30) Foreign Application Priority Data

Mar. 5, 2020 (JP) ................. 2020-038107

(51) Int. Cl.
*H02M 3/335* (2006.01)
*H02M 1/32* (2007.01)
*H02M 7/00* (2006.01)

(52) U.S. Cl.
CPC ....... *H02M 3/33569* (2013.01); *H02M 1/327* (2021.05); *H02M 7/003* (2013.01)

(58) Field of Classification Search
CPC ... H02M 3/33569; H02M 1/327; H02M 7/003
See application file for complete search history.

(56) References Cited

U.S. PATENT DOCUMENTS

| 2003/0133259 A1* | 7/2003 | Meyer | H02M 1/44 |
| | | | 361/677 |
| 2003/0151893 A1* | 8/2003 | Meyer | H02M 7/003 |
| | | | 361/689 |

(Continued)

FOREIGN PATENT DOCUMENTS

| JP | 2004-088983 | 3/2004 |
| JP | 2009-004405 | 1/2009 |

(Continued)

OTHER PUBLICATIONS

International Search Report dated Mar. 16, 2021 with respect to PCT/JP2021/006510.

(Continued)

*Primary Examiner* — Rafael O De Leon Domenech
(74) *Attorney, Agent, or Firm* — IPUSA, PLLC

(57) ABSTRACT

A power converter includes a positive busbar electrically connected to a positive terminal and the first capacitor electrode, and includes a negative busbar electrically connected to a negative terminal and the second capacitor electrode. The power converter includes output busbars each electrically connected to a given output terminal among multiple output terminals, a given high-side switching element among a plurality of high-side switching elements, and a given low-side switching element among a plurality of low-side switching elements. The power converter includes a cooler that cools the high-side switching elements and the low-side switching elements. The power converter includes a housing that accommodates a supply tube and a discharge tube. The positive terminal, the negative terminal, the output terminals, the inlet port, and the outlet port are exposed on (Continued)

the housing. The inlet port, the outlet port, the supply tube, and the discharge tube are separate members from the housing.

20 Claims, 15 Drawing Sheets

(56) References Cited

U.S. PATENT DOCUMENTS

| | | | |
|---|---|---|---|
| 2003/0173839 A1 | 9/2003 | Torii et al. | |
| 2008/0315736 A1 | 12/2008 | Yamada et al. | |
| 2015/0246619 A1 | 9/2015 | Nagao et al. | |
| 2017/0181333 A1* | 6/2017 | Kosaka | H02M 7/003 |
| 2017/0301610 A1* | 10/2017 | Tomita | F28F 9/001 |
| 2019/0296658 A1* | 9/2019 | Chung | H02M 7/003 |
| 2022/0006285 A1* | 1/2022 | Dukaric | H02H 3/087 |

FOREIGN PATENT DOCUMENTS

| | | |
|---|---|---|
| JP | 2011-109740 | 6/2011 |
| JP | 2012-253954 | 12/2012 |
| JP | 2014-087124 | 5/2014 |
| JP | 2014-163558 | 9/2014 |
| JP | 2015-053776 | 3/2015 |
| JP | 2015-109758 | 6/2015 |
| JP | 2015-164367 | 9/2015 |

OTHER PUBLICATIONS

Written Opinion of The International Searching Authority dated Mar. 16, 2021 with respect to PCT/JP2021/006510.

* cited by examiner

POWER CONVERTER

CROSS-REFERENCE TO RELATED APPLICATIONS

The present application is a continuation application of International Application No. PCT/JP2021/006510, filed on Feb. 19, 2021, and designated the U.S., which is based upon and claims priority to Japanese Patent Application No. 2020-038107, filed on Mar. 5, 2020, the contents of which are incorporated herein by reference.

BACKGROUND

1. Field of the Invention

The present disclosure relates to a power converter.

2. Description of the Related Art

A power converter is known to include a flow path organizer that functions as a cooler that cools a plurality of power semiconductor modules, which are provided in a coolant flow path. The power converter is also known to include a housing, where a tube into which a coolant flows and a tube from which the coolant flows out are respectively provided on side surfaces of the housing (see, for example, FIG. 6 of Patent Document 1). Also, a power converter is known to water-cool a busbar unit and a capacitor unit by forming, on a floor of a housing, a coolant inlet tube, a coolant outlet tube, and a flow path connected to a flow path organizer (see, for example, FIG. 25 of Patent Document 1). Further, a power converter is known in which a cooling water inlet hole and a cooling water outlet hole are respectively provided in sidewalls of a housing and a cooling water passage formed by die casting is provided in an lower-side interior of the housing (see, for example, FIG. 3 of Patent Document 2).

CITATION LIST

Patent Document

[Patent Document 1] Japanese Unexamined Patent Application Publication No. 2014-87124
[Patent Document 2] Japanese Unexamined Patent Application Publication No. 2011-109740

SUMMARY

A coolant outlet port and inlet port (hereinafter also referred to as outlet and inlet ports) provided at the housing of the power converter may be required to be repositioned by an end user or the like. However, when additional design modifications, such as layout changes of internal components of the power converter or layout changes of terminals of switching elements that include IGBTs or the like, are drastically made due to the repositioning of the outlet and inlet ports for the coolant, losses or the like in the time or cost caused by the additional design modifications may result.

The present disclosure provides a power converter that can flexibly deal with a design modification due to repositioning of outlet and inlet ports for a coolant.

In the present disclosure, a power converter is provided. The power converter includes:
a positive terminal;
a negative terminal;
multiple output terminals;
a capacitor including a first capacitor electrode and a second capacitor electrode;
a plurality of high-side switching elements each including a first main electrode and a second main electrode;
a plurality of low-side switching elements each including a third main electrode and a fourth main electrode;
a positive busbar electrically connected to the positive terminal, the first capacitor electrode, and first main electrodes;
a negative busbar electrically connected to the negative terminal, the second capacitor electrode, and fourth main electrodes;
a plurality of output busbars electrically connected to the multiple output terminals, second main electrodes, and third main electrodes, respectively;
a cooler for cooling the plurality of high-side switching elements and the plurality of low-side switching elements;
an inlet port into which a coolant flows;
an outlet port from which the coolant flows out;
a supply tube for supplying the coolant flowing from the inlet port to the cooler;
a discharge tube for discharging the coolant flowing out from the cooler, into the outlet port; and
a housing that accommodates
the capacitor,
the plurality of high-side switching elements,
the plurality of low-side switching elements,
the positive busbar,
the negative busbar,
the plurality of output busbars,
the cooler,
the supply tube, and
the discharge tube,
wherein the positive terminal, the negative terminal, the multiple output terminals, the inlet port, and the outlet port are exposed from the housing, and
wherein the inlet port, the outlet port, the supply tube, and the discharge tube are separate members from the housing.

In the present disclosure, a power converter that can flexibly deal with a design modification due to repositioning of outlet and inlet ports for a coolant can be provided.

DESCRIPTION OF THE EMBODIMENTS

Embodiments of the present disclosure will be described below with reference to the drawings. For directions relating to the terms of parallel, a right angle, perpendicular, horizontal, vertical, up and down, left and right, and the like, deviation may be tolerable to an extent to which the effect of the present invention is not impaired. An X-axis direction, a Y-axis direction, and a Z-axis direction respectively refer to a direction parallel to an X-axis, a direction parallel to a Y-axis, and a direction parallel to a Z-axis. The X-axis direction, the Y-axis direction, and the Z-axis direction are mutually perpendicular to one another. An XY-plane, a YZ-plane, and a ZX-plane respectively refer to a virtual plane parallel to the X-axis direction and Y-axis direction, a virtual plane parallel to the Y-axis direction and Z-axis direction, a virtual plane parallel to the Z-axis direction and the X-axis direction. The shape of each component illustrated in each figure is one example, and the present invention is not limited to this example.

Figure 1:
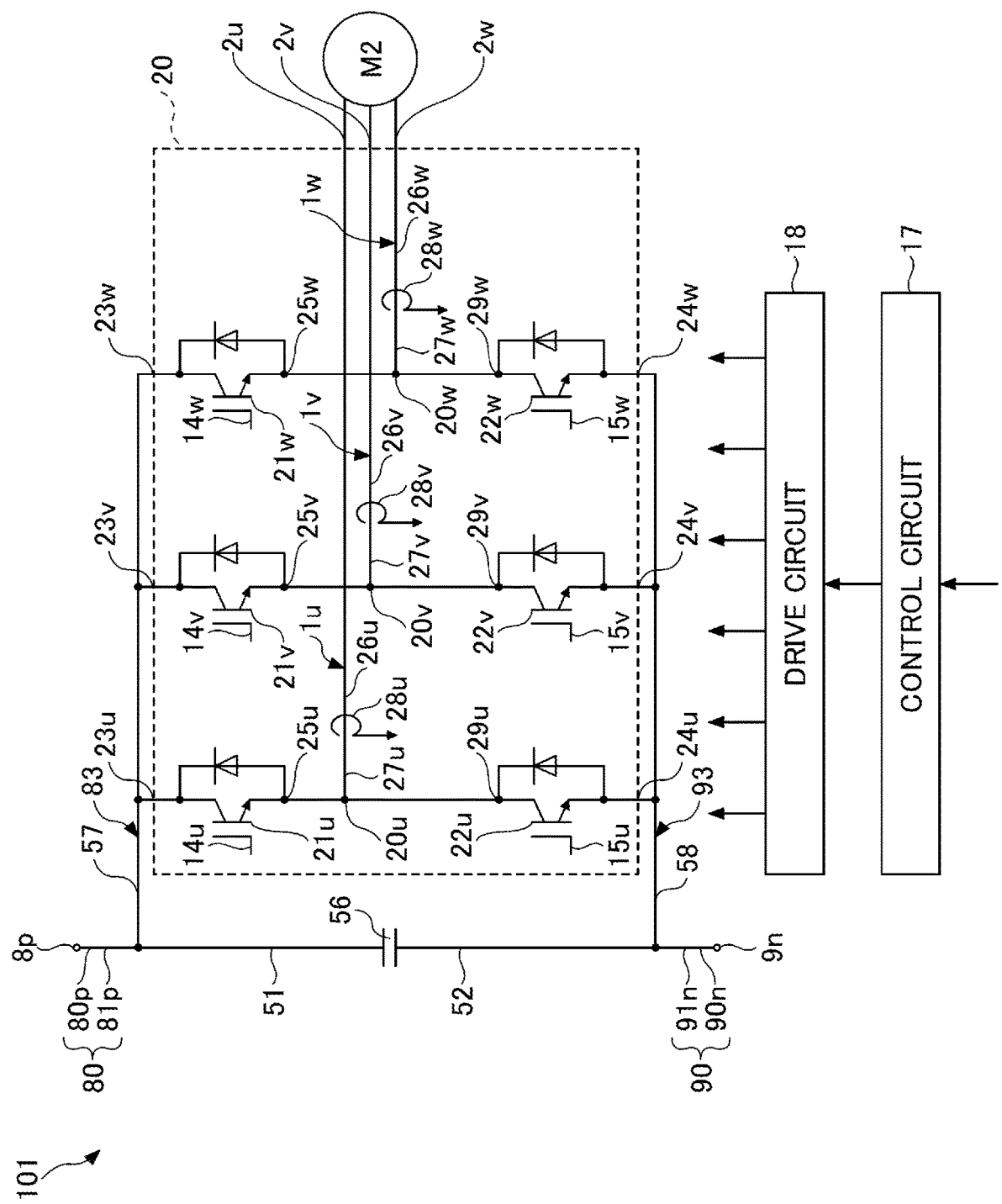
FIG. 1 is a circuit diagram illustrating an example of the configuration of a power converter according to one embodiment.

FIG. 1 is a circuit diagram illustrating an example of the configuration of a power converter according to one embodiment. A power converter 101 illustrated in FIG. 1 is an inverter that converts, into desired AC output power, DC input power that is supplied from a positive terminal 8$p$ and a negative terminal 9$n$ that are a pair of power supply terminals. For example, the power converter 101 is used as an inverter that drives a motor M2 for rotating vehicle wheels. Intended use of the power converter in the present disclosure is not limited to this example.

The power converter 101 includes the positive terminal 8$p$, the negative terminal 9$n$, a plurality of output terminals 2$u$, 2$v$, and 2$w$, a capacitor 56, and a power conversion circuit 20. The power converter 101 includes a positive busbar 83, a negative busbar 93, a plurality of current sensors 28$u$, 28$v$, and 28$w$, a control circuit 17, and a drive circuit 18. The positive busbar 83 includes a first positive busbar 80 and a second positive busbar 57. A negative busbar 93 includes a first negative busbar 90 and a second negative busbar 58. The control circuit 17, or both the control circuit 17 and the drive circuit 18, may be provided in an external device different from the power converter 101.

The positive terminal 8$p$ and the negative terminal 9$n$ are external terminals to which a DC supply voltage is applied by a DC power supply not illustrated. A potential at the positive terminal 8$p$ is higher than that at the negative terminal 9$n$. A specific example of the DC power supply includes a battery, a converter, a regulator, or the like.

The output terminals 2$u$, 2$v$, and 2$w$ are external terminals for receiving and outputting three-phase AC power, and the motor M2 is connected to the output terminals 2$u$, 2$v$, and 2$w$.

The capacitor 56 is a capacitive element that smooths the DC supply voltage to be applied between the positive terminal 8$p$ and the negative terminal 9$n$. A specific example of the capacitor 56 includes an electrolytic capacitor or the like. The capacitor 56 includes a first capacitor electrode 51 and a second capacitor electrode 52. The first capacitor electrode 51 is a terminal electrically connected to the positive busbar 83 (the first positive busbar 80 and the second positive busbar 57), and the second capacitor electrode 52 is a terminal electrically connected to the negative busbar 93 (the first negative busbar 90 and the second negative busbar 58).

The power conversion circuit 20 is an inverter circuit that converts, into three-phase AC power to be supplied to the motor M2, DC power input to the positive busbar 83 and the negative busbar 93 from the positive terminal 8$p$ and the negative terminal 9$n$.

The power conversion circuit 20 is a three-phase bridge circuit that has a plurality of switching elements 21$u$, 21$v$, 21$w$, 22$u$, 22$v$, 22$w$, and 22$w$, and generates three-phase AC power by switching the switching elements 21$u$, 21$v$, 21$w$, 22$u$, 22$v$, and 22$w$. The power conversion circuit 20 includes the switching elements 21$u$, 21$v$, 21$w$, 22$u$, 22$v$, 22$w$ and a plurality of output busbars 1$u$, 1$v$, and 1$w$.

The switching elements 21$u$ and 22$u$ that are in a U-phase are connected in series, and a connection node that is intermediate between these switching elements is connected to the output terminal 2$u$ that is in the U-phase and is connected to a U-phase coil of the motor M2. The switching elements 21$v$ and 22$v$ that are in a V-phase are connected in series, and a connection node that is intermediate between these switching elements is connected to the output terminal 2$v$ that is in a V-phase and is connected to a V-phase coil of the motor M2. The switching elements 21$w$ and 22$w$ that are in a W-phase are connected in series, and a connection node that is intermediate between these switching elements is connected to the output terminal 2$w$ that is in a W-phase and is connected to a W-phase coil of the motor M2.

The switching elements 21$u$, 21$v$, and 21$w$ on a high side are semiconductor elements that respectively include first main electrodes 23$u$, 23$v$, and 23$w$, second main electrodes 25$u$, 25$v$, and 25$w$, and first control electrodes 14$u$, 14$v$, and 14$w$. The first main electrodes 23$u$, 23$v$, and 23$w$ are all electrically connected to the second positive busbar 57. The second main electrodes 25$u$, 25$v$, and 25$w$ are electrically connected to the output busbars 1$u$, 1$v$, and 1$w$, respectively, and are electrically connected to the output terminals 2$u$, 2$v$, and 2$w$ via the output busbars 1$u$, 1$v$, and 1$w$, respectively. The first control electrodes 14$u$, 14$v$, and 14$w$ are each electrically connected to the drive circuit 18.

The switching elements 22$u$, 22$v$, and 22$w$ on a low side are semiconductor elements that respectively include third main electrodes 29$u$, 29$v$, and 29$w$, fourth main electrodes 24$u$, 24$v$, and 24$w$, and second control electrodes 15$u$, 15$v$, and 15$w$. The third main electrodes 29$u$, 29$v$, and 29$w$ are electrically connected to the output busbars 1$u$, 1$v$, and 1$w$, respectively, and are electrically connected to the output terminals 2$u$, 2$v$, and 2$w$ via the output busbars 1$u$, 1$v$, and 1$w$, respectively. The fourth main electrodes 24$u$, 24$v$, and 24$w$ are each electrically connected to the second negative busbar 58. The second control electrodes 15u, 15v, and 15w are each electrically connected to the drive circuit 18.

A diode between the first main electrode and the second main electrode is connected in antiparallel with each of the high-side switching elements 21u, 21v, and 21w. A diode between the third main electrode and the fourth main electrode is connected in antiparallel with each of the low-side switching elements 22u, 22v, and 22w.

The high-side switching elements 21u, 21v, and 21w are voltage-driven semiconductor elements each of which has a control electrode (gate), a first main electrode (a collector or a drain), and a second main electrode (an emitter or a source). The low-side switching elements 22u, 22v, and 22w are voltage-driven semiconductor elements each of which has a control electrode (gate), a third main electrode (the collector or the drain), and a fourth main electrode (the emitter or the source). A specific example of the switching element includes a MOSFET (Metal Oxide Semiconductor Field Effect Transistor), an IGBT (Insulated Gate Bipolar Transistor), or the like. FIG. 1 illustrates a case in which the switching elements 21u, 21v, 21w, 22u, 22v, and 22w are IGBTs each having a gate, a collector, and an emitter.

The switching elements 21u, 21v, 21w, 22u, 22v, and 22w may be switching elements each of which has a semiconductor such as Si (silicon), or may be switching elements each of which has a wide band gap semiconductor, such as SiC (silicon carbide), GaN (gallium nitride), $Ga_2O_3$ (gallium oxide), or diamond. By applying the wide band gap semiconductor to a given switching element, effects of reducing losses of the given switching element are increased.

Each of the positive busbar 83 and the negative busbar 93 is a conductive line member to which the DC supply voltage is applied via the positive terminal 8p and the negative terminal 9n. DC power from the DC power supply not illustrated that is connected via the positive terminal 8p and the negative terminal 9n is supplied to the positive busbar 83 and the negative busbar 93.

The positive busbar 83 is a conductive member that is electrically connected to the positive terminal 8p, the first capacitor electrode 51, and the first main electrodes 23u, 23v, and 23w. The positive busbar 83 is formed of one or more members. In this example, the positive busbar 83 includes the first positive busbar 80 and the second positive busbar 57. The first positive busbar 80 is a line member that is electrically connected between the positive terminal 8p and the first capacitor electrode 51. The second positive busbar 57 is a line member that is electrically connected between the first capacitor electrode 51 and each of the first main electrodes 23u, 23v, and 23w.

The negative busbar 93 is a conductive member electrically connected to the negative terminal 9n, the second capacitor electrode 52, and the fourth main electrodes 24u, 24v, and 24w. The negative busbar 93 is formed of one or more members. In this example, the negative busbar 93 includes the first negative busbar 90 and the second negative busbar 58. The first negative busbar 90 is a line member electrically connected between the negative terminal 9n and the second capacitor electrode 52. The second negative busbar 58 is a line member electrically connected between the second capacitor electrode 52 and each of the fourth main electrodes 24u, 24v, and 24w.

The output busbar 1u is a conductive line member that is electrically connected to the output terminal 2u, the second main electrode 25u, and the third main electrode 29u. The output busbar 1v is a conductive line member that is electrically connected to the output terminal 2v, the second main electrode 25v, and the third main electrode 29v. The output busbar 1w is a conductive line member that is electrically connected to the output terminal 2w, the second main electrode 25w, and the third main electrode 29w. The output busbars 1u, 1v, and 1w may be each formed from one or more members.

The current sensor 28u for the U-phase detects a U-phase current flowing through the U-phase output busbar 1u and outputs a U-phase current detection signal indicating the magnitude of the detected U-phase current, to the control circuit 17. The current sensor 28v for the V-phase detects a V-phase current flowing through the V-phase output busbar 1v and outputs a V-phase current detection signal indicating the magnitude of the detected V-phase current, to the control circuit 17. The current sensor 28w for the W-phase detects a W-phase current flowing through the W-phase output busbar 1v and outputs a W-phase current detection signal indicating the magnitude of the detected W-phase current, to the control circuit 17.

With use of at least two current detection signals among the U-phase current detection signal, the V-phase current detection signal, and the W-phase current detection signal, the control circuit 17 generates control signals (for example, pulse width modulation signals) for generating three-phase AC power from the DC power, by using a known method.

With use of a known method, the drive circuit 18 generates a plurality of drive signals for driving the switching elements 21u, 21v, 21w, 22u, 22v, and 22w, such that three-phase AC power is generated in accordance with the control signals supplied from the control circuit 17. The drive circuit 18 supplies these drive signals to corresponding control electrodes among the control electrodes 14u, 14v, 14w, 15u, 15v, and 15w. With this arrangement, a three-phase alternating current can flow into the motor M2.

Figure 2:
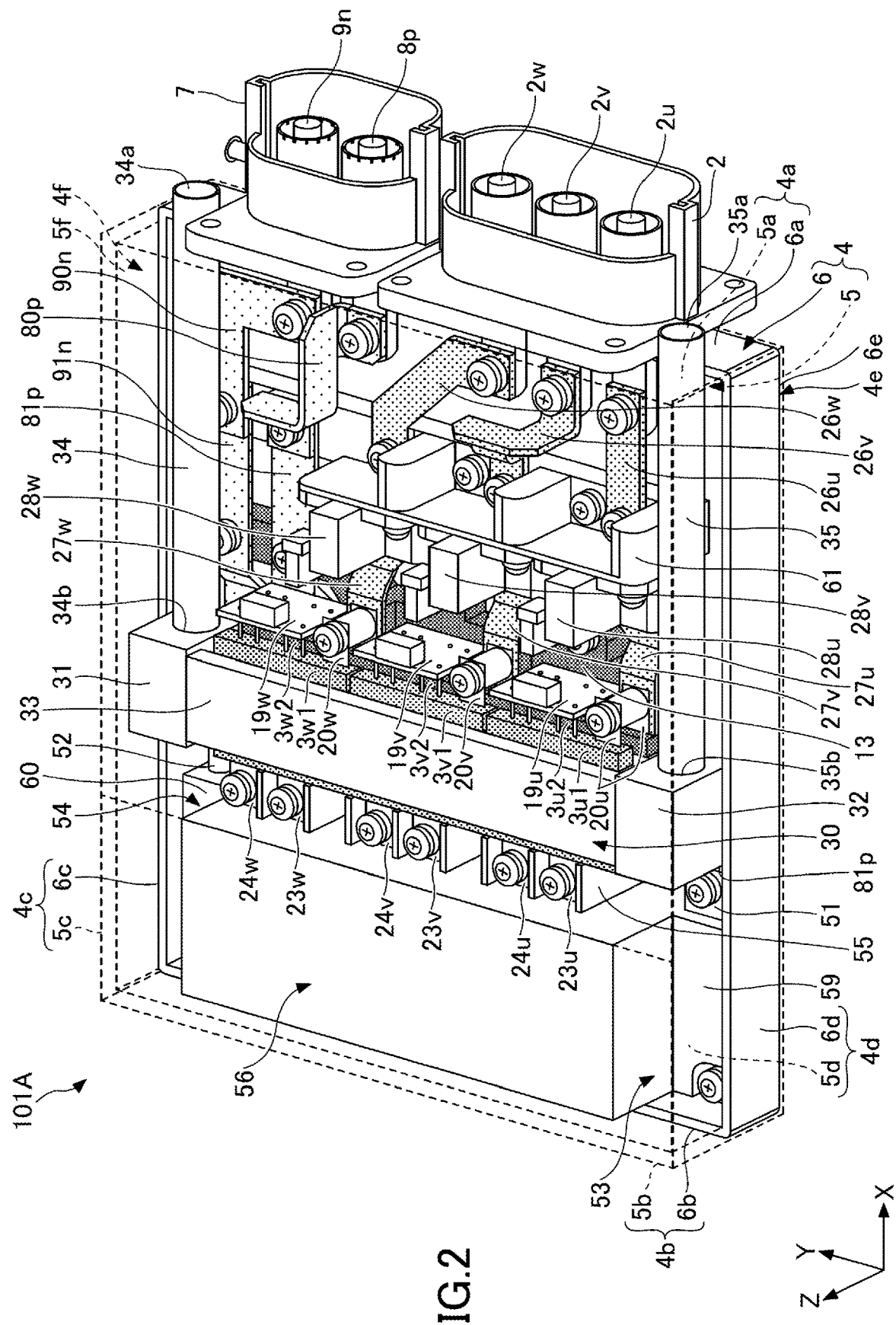
FIG. 2 is a perspective view of an example of a first structure of the power converter according to one embodiment.
Figure 3:
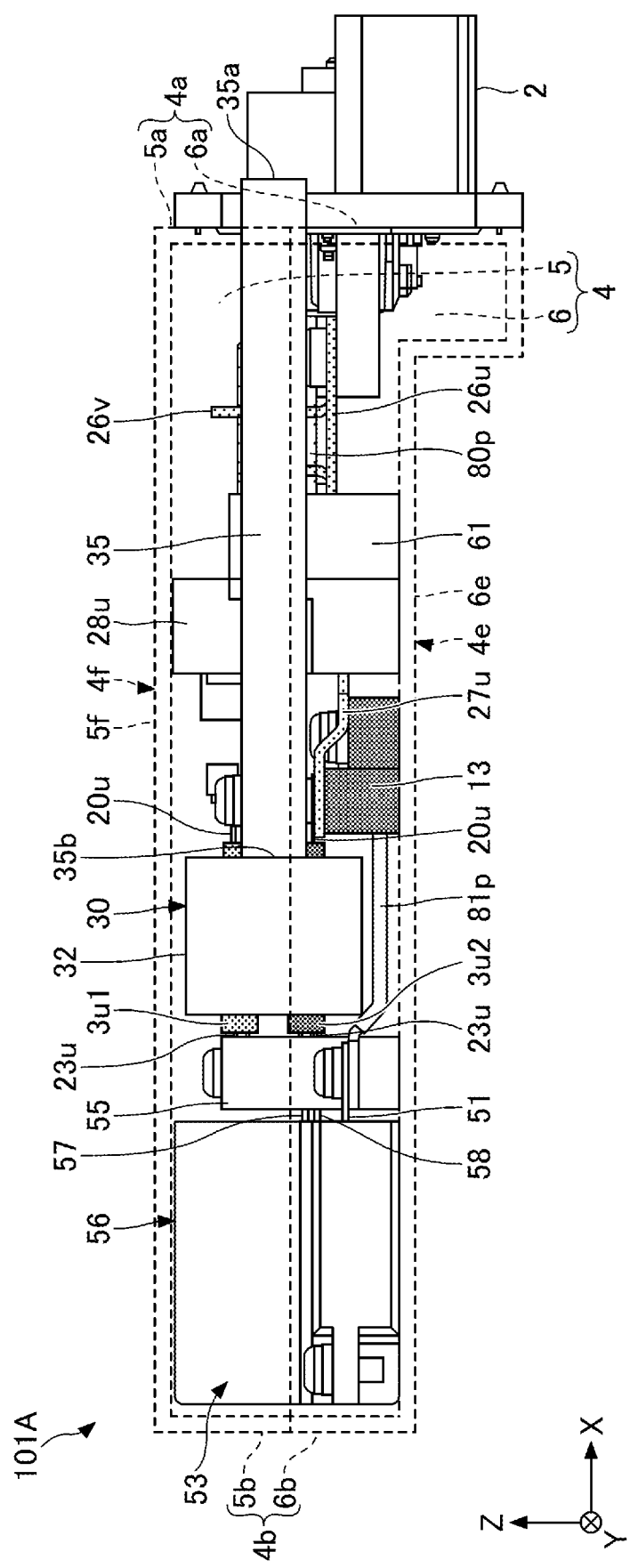
FIG. 3 is a front view of an example of the first structure of the power converter according to one embodiment.
Figure 4:
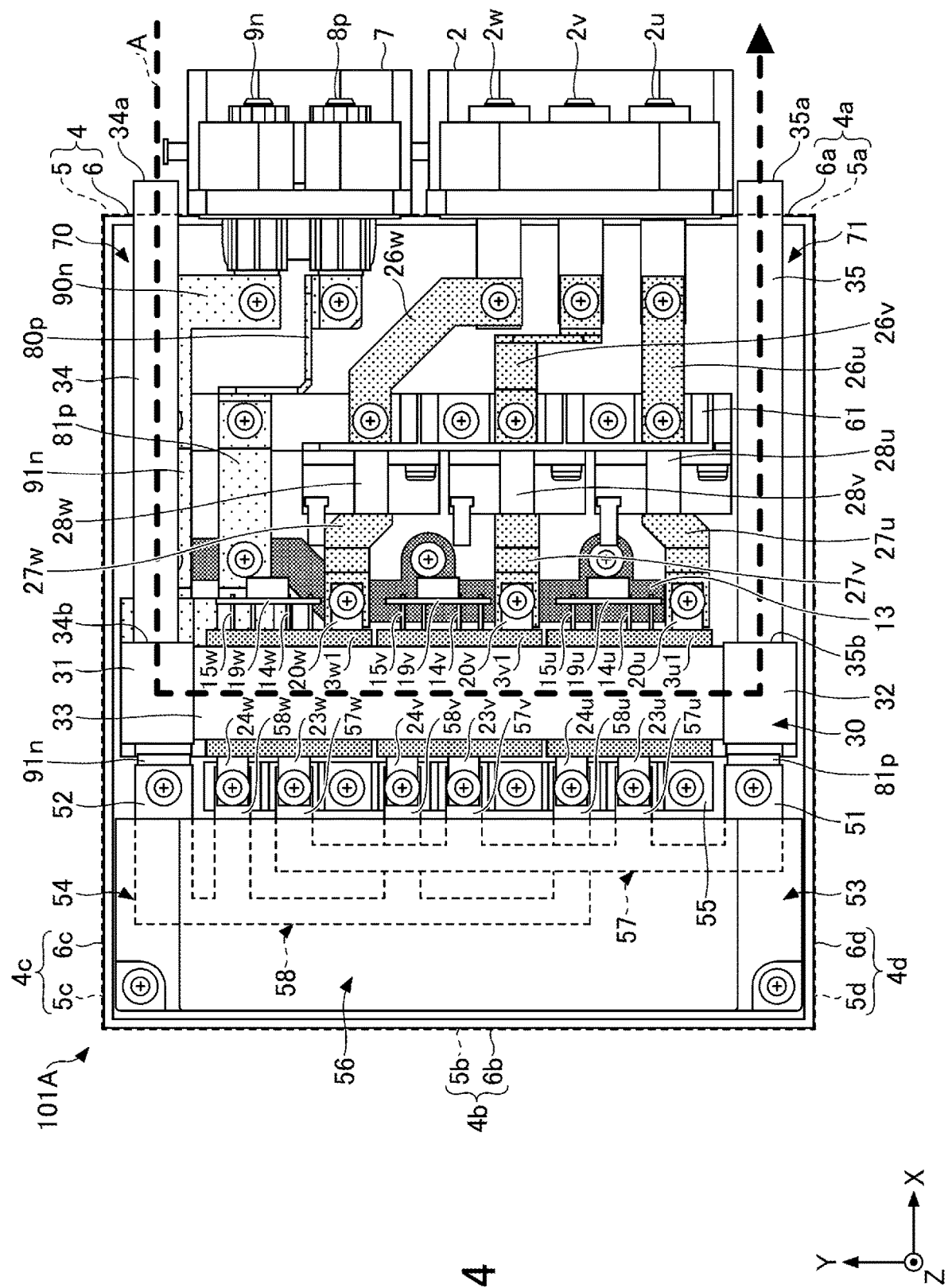
FIG. 4 is a plan view of an example of the first structure of the power converter according to one embodiment.

Hereinafter, an example of a first structure of the power converter 101 that has the circuit configuration illustrated in FIG. 1 will be described with reference to FIGS. 2 to 4. FIG. 2 is a perspective view of the example of the first structure of the power converter according to one embodiment. FIG. 3 is a front view of the example of the first structure of the power converter according to one embodiment. FIG. 4 is a plan view of the example of the first structure of the power converter according to one embodiment. For convenience, in order to make an interior structure of the housing 4, which forms the outline of the power converter, transparent, a cover 5 is indicated by dotted lines in FIGS. 2 and 4, and the cover 5 and a case 6 are indicated by dotted lines in FIG. 3. A power converter 101A illustrated in FIGS. 2 to 4 has the circuit configuration illustrated in FIG. 1.

The power converter 101A includes the housing 4. The housing 4 accommodates various internal components of the power converter 101A. In this example, the housing 4 is a hexahedral box, but another polyhedral box may be used. The housing 4 includes housing surfaces 4a and 4b facing each other in the X-axis direction, housing surfaces 4c and 4d facing each other in the Y-axis direction, and housing surfaces 4e and 4f facing each other in the Z-axis direction. For example, the housing 4 has a configuration that includes a case 6 to which various internal components are directly or indirectly attached, where the configuration also includes the cover 5 that covers the various internal components on the case 6.

The case 6 includes case surfaces 6a and 6b facing each other in the X-axis direction, case surfaces 6c and 6d facing each other in the Y-axis direction, and a case surface 6e in the Z-axis direction. The cover 5 includes cover surfaces 5a and 5b facing each other in the X-axis direction, cover surfaces 5c and 5d facing each other in the Y-axis direction, and a cover surface 5f in the Z-axis direction.

The power converter 101A includes a power connector 7 and an output connector 2. The power connector 7 is connected to a power supply harness not illustrated and is connected to a DC power supply not illustrated via the power supply harness. The output connector 2 is connected to the motor M2 (see FIG. 1) via an output harness not illustrated. In this example, the power connector 7 and the output connector 2 are separate members, but may be used as an integral member.

The power connector 7 is a component disposed on the side of the housing surface 4a so as to protrude from the housing surface 4a. The power connector 7 is fixed to the case surface 6a. The power connector 7 has the positive terminal 8p and the negative terminal 9n. The positive terminal 8p and the negative terminal 9n are exposed from the housing surface 4a (for example, the case surface 6a) of the housing 4.

The output connector 2 is a component disposed on the side of the housing surface 4a so as to protrude from the housing surface 4a. That is, the output connector 2 is disposed on the side of the housing surface 4a, as in the power connector 7. The output connector 2 has the output terminals 2u, 2v, and 2w. The output terminals 2u, 2v, and 2w are exposed from the housing surface 4a (for example, the case surface 6a) of the housing 4.

The power converter 101A includes the capacitor 56. The capacitor 56 is accommodated in the case 6. The capacitor 56 includes the first capacitor electrode 51 and the second capacitor electrode 52 that are spaced apart from each other in the Y-axis direction. The first capacitor electrode 51 is a terminal provided on the capacitor 56 in the negative Y-axis direction and protrudes from the capacitor 56 in a positive X-axis direction. The second capacitor electrode 52 is a terminal provided on the capacitor 56 in the positive Y-axis direction and protrudes from the capacitor 56 in the positive X-axis direction.

The power converter 101A includes two U-phase modules 3u1 and 3u2, two V-phase modules 3v1 and 3v2, and two W-phase modules 3w1 and 3w2. The U-phase module 3u1, the V-phase module 3v1, and the W-phase module 3w1 are aligned in the Y-axis direction. The U-phase module 3u2, the V-phase module 3v2, and the W-phase module 3w2 are aligned in the Y-axis direction, so as to be in the Z-axis direction (in this example, the negative Z-axis direction) with respect to the U-phase module 3u1, the V-phase module 3v1, and the W-phase module 3w1, respectively. Each of the two U-phase modules 3u1 and 3u2 incorporates a U-phase arm circuit in which the high-side switching element 21u and the low-side switching element 22u are connected in series. Each of the two V-phase modules 3v1 and 3v2 incorporates a V-phase arm circuit in which the high-side switching element 21v and the low-side switching element 22v are connected in series. Each of the W-phase modules 3w1 and 3w2 incorporates a U-phase arm circuit in which the high-side switching element 21w and the low-side switching element 22w are connected in series.

Each of six modules 3 (3u1, 3u2, 3v1, 3v2, 3w1, and 3w2) has a side surface of a first package in the negative X-axis direction and a side surface of a second package in the positive X-axis direction. A first main electrode 23u and a fourth main electrode 24u that are respectively in the U-phase modules 3u1 and 3u2, a first main electrode 23v and a fourth main electrode 24v that are respectively in the V-phase modules 3v1 and 3v2, and a first main electrode 23w and a fourth main electrode 24w that are respectively in the W-phase modules 3w1 and 3w2, protrude in the negative X-axis direction from the side surface of the first package. A first second control electrode 14u and a second control electrode 15u that are respectively in the U-phase modules 3u1 and 3u2, a first control electrode 14v and a second control electrode 15v that are respectively in the V-phase modules 3v1 and 3v2, and a first control electrode 14w and a second control electrode 15w that are respectively in the W-phase modules 3w1 and 3w2, protrude in the positive X-axis direction from the side surface of the first package. Each of the output electrodes 20u, 20v, and 20w that is provided in a given module among the six modules 3 protrudes in the positive X-axis direction from the side surface of the first package. The output electrode 20u for two U-phase modules 3u1 and 3u2 is commonly used to be connected to the second main electrode 25u and the third main electrode 29u, within the respective modules. The output electrode 20v for two V-phase modules 3v1 and 3v2 is commonly used to be connected to the second main electrode 25v and the third main electrode 29v, within the respective modules. The output electrode 20w for two W-phase modules 3w1 and 3w2 is commonly used to be connected to the second main electrode 25w and the third main electrode 29w, within the respective modules.

In FIGS. 2 to 4, the power converter 101A includes substrate connectors 19u, 19v, and 19w. The first control electrode 14u and the second control electrode 15u are connected to the substrate connector 19u and are electrically connected, via the substrate connector 19u, to the drive circuit 18 formed on a substrate not illustrated. The first control electrode 14v and the second control electrode 15v are connected to the substrate connector 19v and are electrically connected, via the substrate connector 19v, to the drive circuit 18 formed on a substrate not illustrated. The first control electrode 14w and the second control electrode 15w are connected to the substrate connector 19w and are electrically connected, via the substrate connector 19w, to the drive circuit 18 formed on the substrate not illustrated.

In FIGS. 2 to 4, the power converter 101A includes a first positive bar 80p and a second positive bar 81p as members that constitute the first positive busbar 80 (FIG. 1) electrically connected between the positive terminal 8p and the first capacitor electrode 51. The first positive bar 80p has one end electrically connected to the positive terminal 8p and has the other end electrically connected to one end of the second positive bar 81p. The second positive bar 81p has one end electrically connected to the other end of the first positive bar 80p and has the other end electrically connected to the first capacitor electrode 51. The second positive bar 81p passes through a space between the cooler 30 and the housing surface 4e (for example, the case surface 6e), in the Y-axis direction.

One end of the first positive bar 80p and either the positive terminal 8p or an indirect member, which is conductively connected to the positive terminal 8p provided in the power connector 7, are tightened together by a fastening member such as a screw. The power connector 7 and the case surface 6a forming the housing surface 4a are tightened together by a fastening member such as a screw. One end of the second positive bar 81p and the other end of the first positive bar 80p are tightened together at the case surface 6e through an insulating member not illustrated, by a fastening member. The first capacitor electrode 51 and the other end of the second positive bar 81p are tightened together at the case surface 6e through an insulating member not illustrated, by a fastening member.

The power converter 101A includes a first negative bar 90n and a second negative bar 91n as members that constitute the first negative busbar 90 (FIG. 1) electrically connected between the negative terminal 9n and the second capacitor electrode 52. The first negative bar 90n has one end electrically connected to the negative terminal 9n and has the other end electrically connected to one end of the second negative bar 91n. The second negative bar 91n has one end electrically connected to the other end of the first negative bar 90n and has the other end electrically connected to the second capacitor electrode 52. The second negative bar 91n passes, in the X-axis direction, through a space between the cooler 30 and the housing surface 4e (e.g., the case surface 6e). The cooler 30 is spaced apart from a given housing surface and may be fixed by connecting each electrode of interposed modules, to a surrounding component.

One end of the first negative bar 90n and either the negative terminal 9n or an indirect member, which is conductively connected to the negative terminal 9n provided in the power connector 7, are tightened together by a fastening member such as a screw. The power connector 7 and the case surface 6a forming the housing surface 4a are tightened together by fastening members such as screws. One end of the second negative bar 91n and the other end of the first negative bar 90n are tightened together at the case surface 6e through an insulating member not illustrated, by a fastening member. The second capacitor electrode 52 and the other end of the second negative bar 91n are tightened together at the case surface 6e through an insulating member not illustrated, by a fastening member.

The power converter 101A includes the second positive busbar 57 electrically connected to the first capacitor electrode 51, inside the capacitor 56, and includes a second negative busbar 58 electrically connected to the second capacitor electrode 52, inside the capacitor 56. The power converter 101A also includes a supporting member 55 that supports the second positive busbar 57 and the second negative busbar 58.

The supporting member 55 has a configuration in which a plurality of partition plates each protruding in the positive Z-axis direction from a base extending in the Y-axis direction are ranged in the Y-axis direction. The base of the supporting member 55 is fixed to the housing surface 4e (e.g., the case surface 6e) by fastening members such as screws. The first main electrodes 23u, 23v, and 23w, the fourth main electrodes 24u, 24v, and 24w, a portion of the second positive busbar 57, and a portion of the second negative busbar 58 are each disposed in a space adjacent to a corresponding partition plate in the supporting member 55.

The second positive busbar 57 has comb teeth 57u, 57v, and 57w each protruding from the capacitor 56 in the positive X-axis direction. The comb teeth 57u, 57v and 57w are positive busbar terminals electrically connected to the first main electrodes 23u, 23v and 23w, respectively. At least a portion of the second positive busbar 57 is covered by the capacitor 56.

The second positive busbar 57 is, for example, a comb-like member in which each of the comb teeth 57u, 57v, and 57w ranged in the Y-axis direction extends in the X-axis direction, and the comb teeth 57u, 57v, and 57w are supported by the supporting member 55. The comb teeth 57u, 57v, and 57w are electrically connected to the first main electrodes 23u, 23v, and 23w of the high-side switching elements 21u, 21v, and 21w, respectively. Each first main electrode, among the first main electrodes 23u, 23v, and 23w, and a corresponding comb tooth among the comb teeth 57u, 57v, and 57w are tightened together at the supporting member 55 by a fastening member such as a screw.

When the position of each of the first main electrodes 23u, 23v, and 23w in the Z-axis direction is different from the position of a corresponding comb tooth among the comb teeth 57u, 57v, and 57w, each of the first main electrodes 23u, 23v, and 23w may be electrically connected to the corresponding comb tooth among the comb teeth 57u, 57v, and 57w, via a spacer that extends in the Z-axis direction.

The second negative busbar 58 has comb teeth 58u, 58v, and 58w each protruding from the capacitor 56 in the positive X-axis direction. The comb teeth 58u, 58v, and 58w are negative busbar terminals electrically connected to the fourth main electrodes 24u, 24v, and 24w, respectively. At least a portion of the second negative busbar 58 is covered by the capacitor 56.

As in the second positive busbar 57, the second negative busbar 58 is, for example, a comb-like member in which each of comb teeth 58u, 58v, and 58w ranged in the Y-axis direction protrudes in the X-axis direction, and the comb teeth 58u, 58v, and 58w are supported by the supporting member 55. The comb teeth 58u, 58v, and 58w are electrically connected to the fourth main electrodes 24u, 24v, and 24w of the low-side switching elements 22u, 22v, and 22w, respectively. Each fourth main electrode, among the fourth main electrodes 24u, 24v, and 24w, and a corresponding comb tooth among the comb teeth 58u, 58v, and 58w are tightened together at the supporting member 55 by a fastening member such as a screw.

The power converter 101A includes a first U-phase bar 27u and a second U-phase bar 26u as members that constitute the output busbar 1u (FIG. 1) electrically connected to the output terminal 2u, the second main electrode 25u, and the third main electrode 29u. The first U-phase bar 27u has one end electrically connected to the second main electrode 25u and the third main electrode 29u via the output electrode 20u and has the other end electrically connected to one end of the second U-phase bar 26u. The second U-phase bar 26u has one end electrically connected to the other end of the first U-phase bar 27u and has the other end electrically connected to the output terminal 2u.

One end of the first U-phase bar 27u and the output electrode 20u for two U-phase modules 3u1 and 3u2 are tightened together at a terminal block 13, by a fastening member such as a screw. Similarly, the other end of the first U-phase bar 27u and one end of the second U-phase bar 26u are tightened together at a supporting platform 61, by a fastening member. The other end of the second U-phase bar 26u and either the output terminal 2u or an indirect member conductively connected to the output terminal 2u, which is provided in the output connector 2, are tightened together by a fastening member.

The power converter 101A includes a first V-phase bar 27v and a second V-phase bar 26v as members that constitute the output busbar 1v (FIG. 1) electrically connected to the output terminal 2v, the second main electrode 25v, and the third main electrode 29v. The connection configuration of the output busbar 1v is the same as the connection configuration of the output busbar 1u, and thus description thereof is omitted by reference to the description provided above.

The power converter 101A includes a first W-phase bar 27w and a second W-phase bar 26w as members that constitute the output busbar 1w (FIG. 1) electrically connected to the output terminal 2w, the second main electrode 25w, and the third main electrode 29w. The connection configuration of the output busbar 1w is the same as the connection configuration of the output busbar 1*u*, and thus description thereof is omitted by reference to the description provided above.

The power converter 101A includes the current sensors 28*u*, 28*v*, and 28*w*. The current sensor 28*u* detects a U-phase current flowing through the first U-phase bar 27*u*, the current sensor 28*v* detects a W-phase current flowing through the first V-phase bar 27*v*, and the current sensor 28*w* detects a W-phase current flowing through the first W-phase bar 27*w*. Each of the current sensors 28*u*, 28*v*, and 28*w* is electrically connected to the control circuit 17 formed on a substrate not illustrated, and outputs a current detection signal for a given phase, to the control circuit 17.

The power converter 101A includes the cooler 30, an inlet port 34*a*, an outlet port 35*a*, a supply tube 34 and a discharge tube 35.

The cooler 30 cools the high-side switching elements 21*u*, 21*v*, and 21*w* and the low-side switching elements 22*u*, 22*v*, and 22*w* that are respectively within the six modules 3. The cooler 30 extends in the Y-axis direction and is located between the capacitor 56 and the output busbars 1*u*, 1*v*, and 1*w*. The cooler 30 has a cooling tube 33, a first header 31, and a second header 32.

The cooling tube 33 extends in the Y-axis direction and has one or more flow paths through which a coolant A such as cooling water flows. The first header 31 is a coupling point where the supply tube 34 in the negative X-axis direction is coupled at one end, and is attached to the end of the cooling tube 33 in the positive Y-axis direction. The first header 31 has a coolant supply port 34*b* coupled to the end of the supply tube 34 in the negative X-axis direction and serves to distribute the coolant A flowing from the supply tube 34 equally among a plurality of flow paths of multiple cooling tubes 33. The second header 32 is a coupling point where the discharge tube 35 in the negative X-axis direction is connected at one end, and is attached to the end of the cooling tube 33 in the negative Y-axis direction. The second header 32 has a coolant discharge port 35*b* coupled to the end of the discharge tube 35 in the negative X-axis direction. The second header 32 functions to meet coolants A flowing out from the cooling tubes 33 and to discharge the coolant into the discharge tube 35.

The inlet port 34*a* is a point where the coolant A flows in, and a coolant supply hose not illustrated is connected to the inlet port 34*a*. In this example, the inlet port 34*a* is disposed on the side of the housing surface 4*a* so as to protrude from the case surface 6*a* that forms the housing surface 4*a*. The outlet port 35*a* is a point where the coolant such as cooling water flows out, and a coolant discharge hose not illustrated is connected to the outlet port 35*a*. In this example, the outlet port 35*a* is disposed on the side of the housing surface 4*a* so as to protrude from the case surface 6*a* that forms the housing surface 4*a*. The positive terminal 8*p*, the negative terminal 9*n*, and the output terminals 2*u*, 2*v*, and 2*w* are located between the inlet port 34*a* and the outlet port 35*a*.

The supply tube 34 is a member that supplies the coolant A flowing in from the inlet port 34*a*, to the cooler 30, and extends in the X-axis direction. The inlet port 34*a* is provided at the end of the supply tube 34 in the positive X-axis direction, and the first header 31 is connected to the end of the supply tube 34 in the negative X-axis direction. The inlet port 34*a* is exposed from the housing surface 4*a* (e.g., the cover surface 5*a*) of the housing 4 and protrudes from the housing surface 4*a* through a hole formed in the cover surface 5*a*, for example.

The discharge tube 35 is a member that discharges the coolant A flowing out from the cooler 30, into the outlet port 35*a*, and extends in the X-axis direction. The outlet port 35*a* is provided at the end of the discharge tube 35 in the positive X-axis direction, and the second header 32 is connected to the end of the discharge tube 35 in the negative X-axis direction. The inlet port 34*a* is exposed from the housing surface 4*a* (e.g., the case surface 6*a*) of the housing 4 and protrudes from the housing surface 4*a* through a hole formed in the cover surface 5*a*, for example.

With this arrangement, in the power converter 101A, the housing 4 accommodates the capacitor 56, the high-side switching elements 21*u*, 21*v*, and 21*w*, the low-side switching elements 22*u*, 22*v*, and 22*w*, the positive busbar 83, the negative busbar 93, and the output busbars 1*u*, 1*v*, and 1*w*. The housing 4 also accommodates the cooler 30, the supply tube 34, and the discharge tube 35. The inlet port 34*a*, the outlet port 35*a*, the supply tube 34, and the discharge tube 35 are separate members from the housing 4. These are separate members from the housing 4, and thus the inlet port 34*a* and the outlet port 35*a* are easily repositioned in comparison to a manner in which components having the same functions as the components described above are used as a member of the housing (for example, a manner in which components having the same functions as those described above, as well as the housing, are integrally formed by die casting).

For example, even if the inlet port 34*a* and the outlet port 35*a* are required to be repositioned by an end user or the like, positions of the inlet port 34*a* and outlet port 35*a* that are exposed can be easily changed because the inlet port 34*a* and the outlet port 35*a* are separate members from the housing 4. Further, because the supply tube 34 and the discharge tube 35 are separate members from the housing 4, the tube routing of each of the supply tube 34 and the discharge tube 35 can be easily changed. Even if additional design modifications of the housing 4 is made by changing the positions of the inlet port 34*a* and the outlet port 35*a*, the tube routing of the supply tube 34 and the discharge tube 35 can be easily changed. Therefore, losses or the like in the time and cost caused by the design modification such as a layout change of internal components can be suppressed.

With this arrangement, the power converter 101A can flexibly dealt with design modifications to be made due to repositioning of the inlet port 34*a* and the outlet port 35*a*.

For example, the design of the power converter 101A (FIG. 4) in which the inlet port 34*a* and the outlet port 35*a* are exposed from the housing surface 4*a* can be easily changed to a power converter 101B (FIG. 5) in which the inlet port 34*a* and outlet port 35*a* are exposed from the housing surface 4*b*. This is because the tube routing of the supply tube 34 can easily be changed from a side of the first header 31 in the positive X-axis direction, to a side of the first header 31 in the negative X-axis direction, and further the tube routing of the discharge tube 35 can easily be changed from a side of the second header 32 in the positive X-axis direction, to a side of the second header 32 in the negative X-axis direction.

For example, the design of the power converter 101A (FIG. 4) in which the inlet port 34*a* and the outlet port 35*a* are exposed from the housing surface 4*a* can be easily changed to a power converter 101C (FIG. 6) in which the inlet port 34*a* is exposed from the housing surface 4*c* and the outlet port 35*a* is exposed from the housing surface 4*d*. This is because the tube routing of the supply tube 34 can easily be changed from the side of the first header 31 in the positive X-axis direction, to the side of the first header 31 in the positive Y-axis direction, and further the tube routing of the discharge tube 35 can easily be changed from the side of the second header 32 in the positive X-axis direction, to the side of the second header 32 in the negative Y-axis direction 32.

Figure 7:
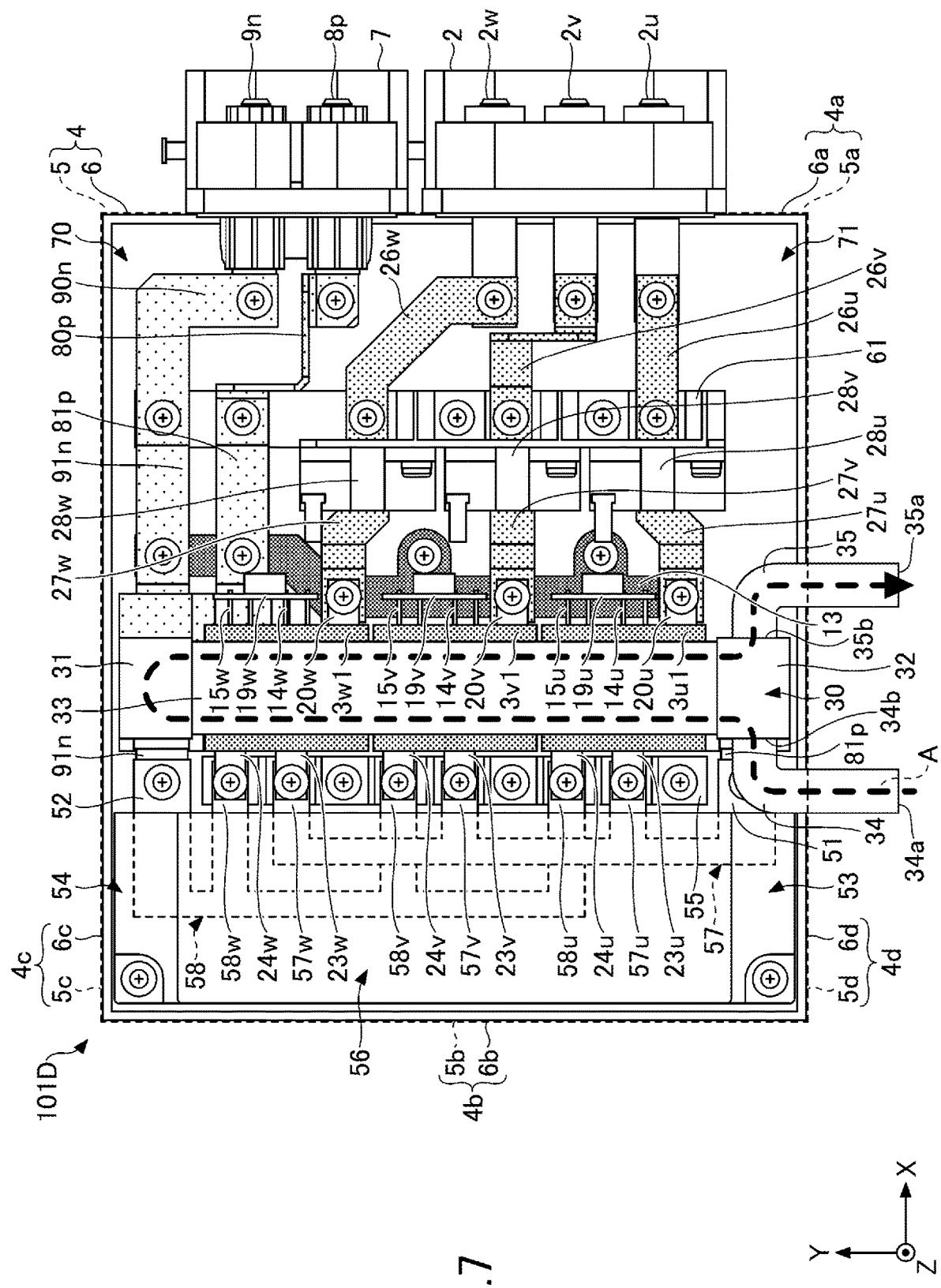
FIG. 7 is a plan view of an example of a fourth structure of the power converter according to one embodiment.

For example, the design of the power converter 101A (FIG. 4) in which the inlet port 34a and the outlet port 35a are exposed from the housing surface 4a can be easily changed to a power converter 101D (FIG. 7) in which the inlet port 34a and the outlet port 35a are exposed from the housing surface 4d. This is because the tube routing of the supply tube 34 can easily be changed from the side of the first header 31 in the positive X-axis direction, to the side of the second header 32 in the negative Y-axis direction, and further the tube routing of the discharge tube 35 can easily be changed from the side of the second header 32 in the positive X-axis direction, to the side of the second header 32 in the negative Y-axis direction.

When any power converters among the power converters 101A, 101B, 101C, and 101D are interchangeably used, design modifications to be made due to the repositioning of the inlet port 34a and the outlet port 35a can also be dealt with. As one example, the design of the power converter 101C can be changed to the power converter 101B. With application of the techniques in the present disclosure, a power converter not illustrated that has another configuration is used to flexibly deal with design modifications due to repositioning of the inlet port 34a and outlet port 35a.

In the power converter 101A illustrated in FIGS. 2 to 4, there is an open space 54 between the housing surface 4b, which faces the housing surface 4a from which the inlet port 34a is exposed, and the first header 31 coupled to the supply tube 34. More specifically, the open space 54 is at a location surrounded by the housing surface 4c, the housing surface 4b, and the first header 31. Similarly, there is an open space 53 between the housing surface 4b, which faces the housing surface 4a from which the outlet port 35a is exposed, and the second header 32 coupled to the discharge tube 35. More specifically, the open space 53 is at a location surrounded by the housing surface 4d, the housing surface 4b, and the second header 32. In this case, the housing surface 4a is an example of a first housing surface, the housing surface 4b is an example of a second housing surface facing the first housing surface, and the housing surface 4c or the housing surface 4d is an example of a third housing surface adjacent to the second housing surface. If the open space 54 is preliminarily provided, the supply tube 34 can be easily rearranged to be in the open space 54, and if the open space 53 is preliminarily provided, the discharge tube 35 can be easily rearranged to be in the open space 53. Accordingly, the design change from the power converter 101A (FIG. 4) to the power converter 101B (FIG. 5) can be flexibly dealt with.

Figure 5:
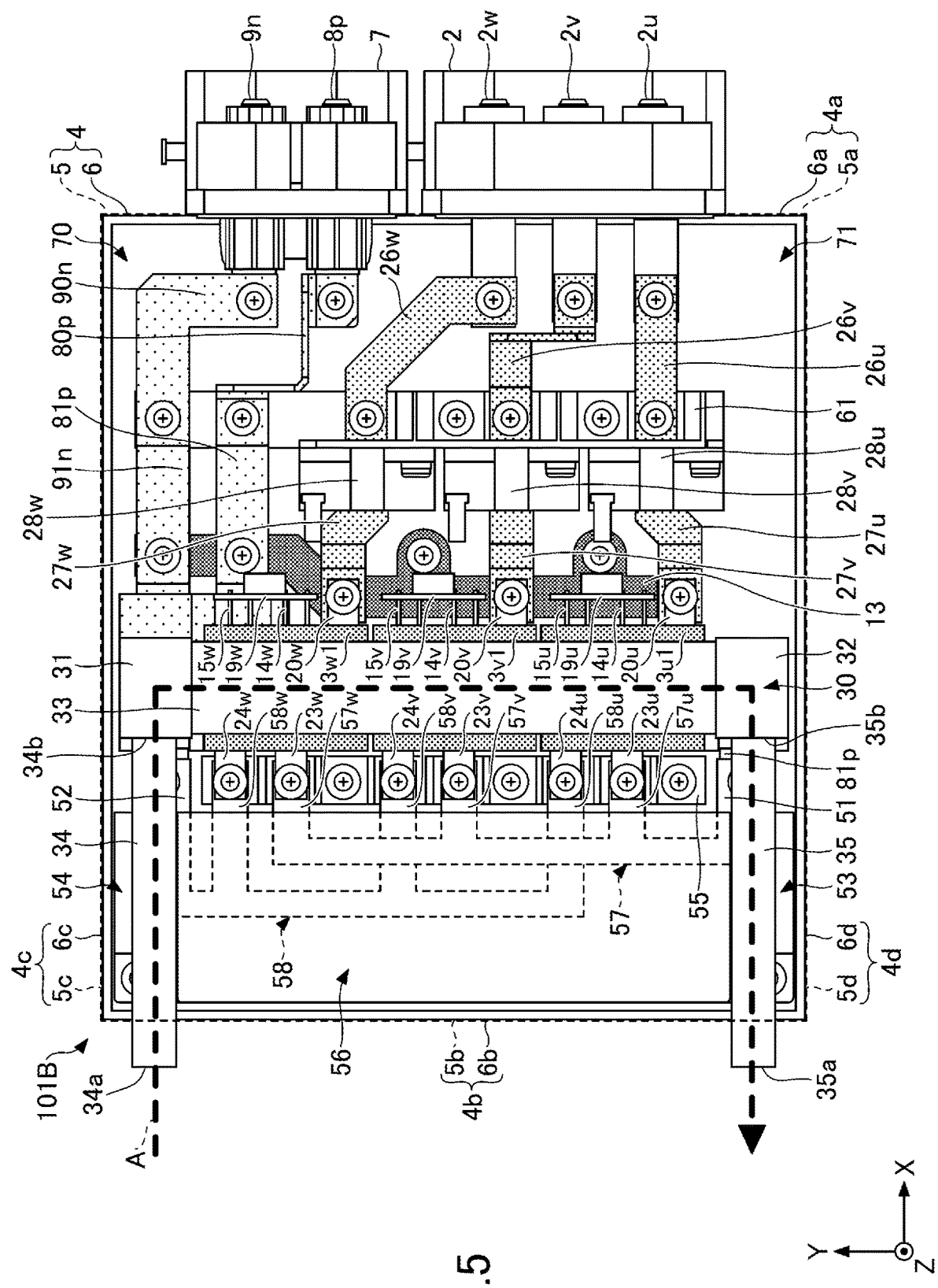
FIG. 5 is a plan view of an example of a second structure of the power converter according to one embodiment.

In the power converter 101B illustrated in FIG. 5, there is an open space 70 between the housing surface 4a, which faces the housing surface 4b from which the inlet port 34a is exposed, and the first header 31 coupled to the supply tube 34. More specifically, the open space 70 is at a location surrounded by the housing surface 4c, the housing surface 4a, the first header 31, and the first positive busbar 80. Similarly, there is an open space 71 between the housing surface 4a, which faces the housing surface 4b from which the outlet port 35a is exposed, and the second header 32 coupled to the discharge tube 35. More specifically, the open space 71 is at a location surrounded by the housing surface 4d, the housing surface 4a, the second header 32, and the output busbars 1u, 1v, and 1w. In this case, the housing surface 4b is an example of a first housing surface, the housing surface 4a is an example of a second housing surface facing the first housing surface, and the housing surface 4c or the housing surface 4d is an example of a third housing surface adjacent to the second housing surface. If the open space 70 is preliminarily provided, the supply tube 34 can easily be rearranged to be in the open space 70, and if the open space 71 is preliminarily provided, the discharge tube 35 can easily be rearranged to be in the open space 71. Accordingly, the design change from the power converter 101B (FIG. 5) to any one among the power converter 101A (FIG. 4), the power converter 101C (FIG. 6), and the power converter 101D (FIG. 7), can be flexibly dealt with.

Figure 6:
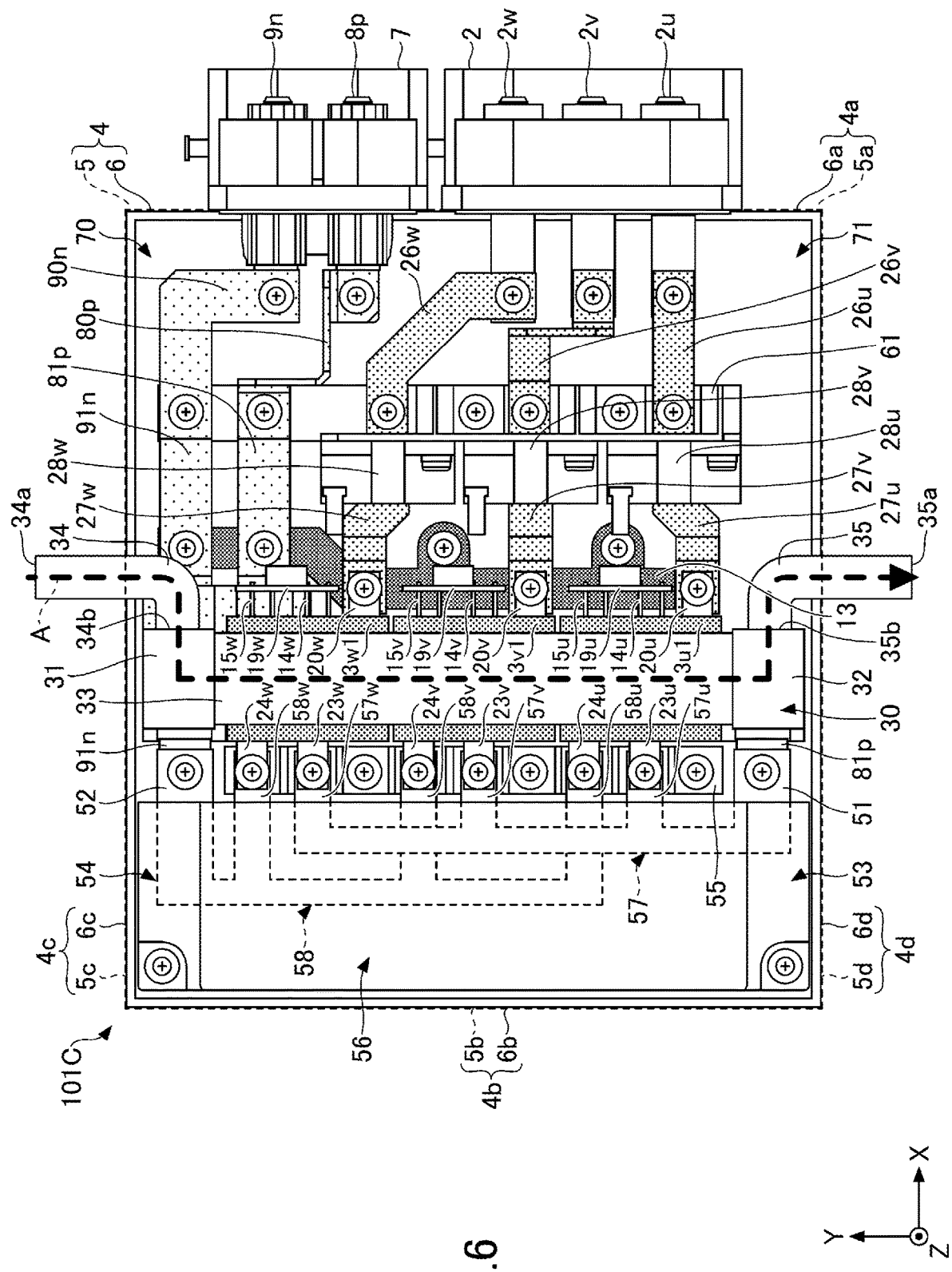
FIG. 6 is a plan view of an example of a third structure of the power converter according to one embodiment.

In the power converter 101C illustrated in FIG. 6, there is an open space 54 between the housing surface 4b, which is adjacent to the housing surface 4c from which the inlet port 34a is exposed, and the first header 31 coupled to the supply tube 34. In this case, the housing surface 4c is an example of a first housing surface, and the housing surface 4b is an example of a second housing surface adjacent to the first housing surface. Similarly, there is an open space 53 between the housing surface 4b, which is adjacent to the housing surface 4d from which the outlet port 35a is exposed, and the second header 32 coupled to the discharge tube 35. In this case, the housing surface 4d is an example of a first housing surface, and the housing surface 4b is an example of a second housing surface adjacent to the first housing surface. If the open space 54 is preliminarily provided, the supply tube 34 can be easily rearranged to be in the open space 54, and if the open space 53 is preliminarily provided, the discharge tube 35 can be easily rearranged to be in the open space 53. Accordingly, the design change from the power converter 101C (FIG. 6) to either the power converter 101B (FIG. 5) or the power converter 101D (FIG. 7) can be flexibly dealt with.

As illustrated in each of FIGS. 4 and 6, the open space 54 is on a side of the first header 31 opposite the side of the supply tube 34 being located. In this example, the open space 54 is on the same XY plane as the supply tube 34. With this arrangement, the supply tube 34 can be located in the open space 54 without changing the shape of the supply tube 34 or with minimizing changes in the shape of the supply tube 34. Similarly, as illustrated in each of FIGS. 4, 6, and 7, the open space 53 is on a side of the second header 32 opposite the side of the discharge tube 35 being located. In this example, the open space 53 is on the same XY plane as the discharge tube 35. With this arrangement, the discharge tube 35 can be disposed in the open space 53 without changing the shape of the discharge tube 35 or with minimizing changes in the shape of the discharge tube 35. Each of the open spaces 70 and 71 illustrated in FIG. 5 can also be defined by the positional relationship between the open spaces, as in the open spaces 53 and 54.

The open space 54 is partitioned by the capacitor 56. In the example illustrated in FIG. 2, the open space 54 is partitioned by a step 60 formed in the capacitor 56 in order to fasten the capacitor 56 to the case 6. More specifically, the open space 54 is partitioned by an outer surface of the cover extending in the positive Y-axis direction and the positive Z-axis direction of the capacitor 56. The open space 53 is partitioned by the capacitor 56. In the example illustrated in FIG. 2, the open space 53 is partitioned by a step 59 formed in the capacitor 56 in order to fasten the capacitor 56 to the case 6. More specifically, the open space 53 is partitioned by the outer surface of the cover extending in the negative Y-axis direction and the positive Z-axis direction of the capacitor 56.

Each of the open spaces 53 and 54 is partitioned by the capacitor 56 and thus the capacitor 56 can be prevented from hitting the supply tube and discharge tube that are respectively disposed in the open spaces 53 and 54. With the capacitor 56, the open spaces 53 and 54 can be also easily formed.

Figure 8:
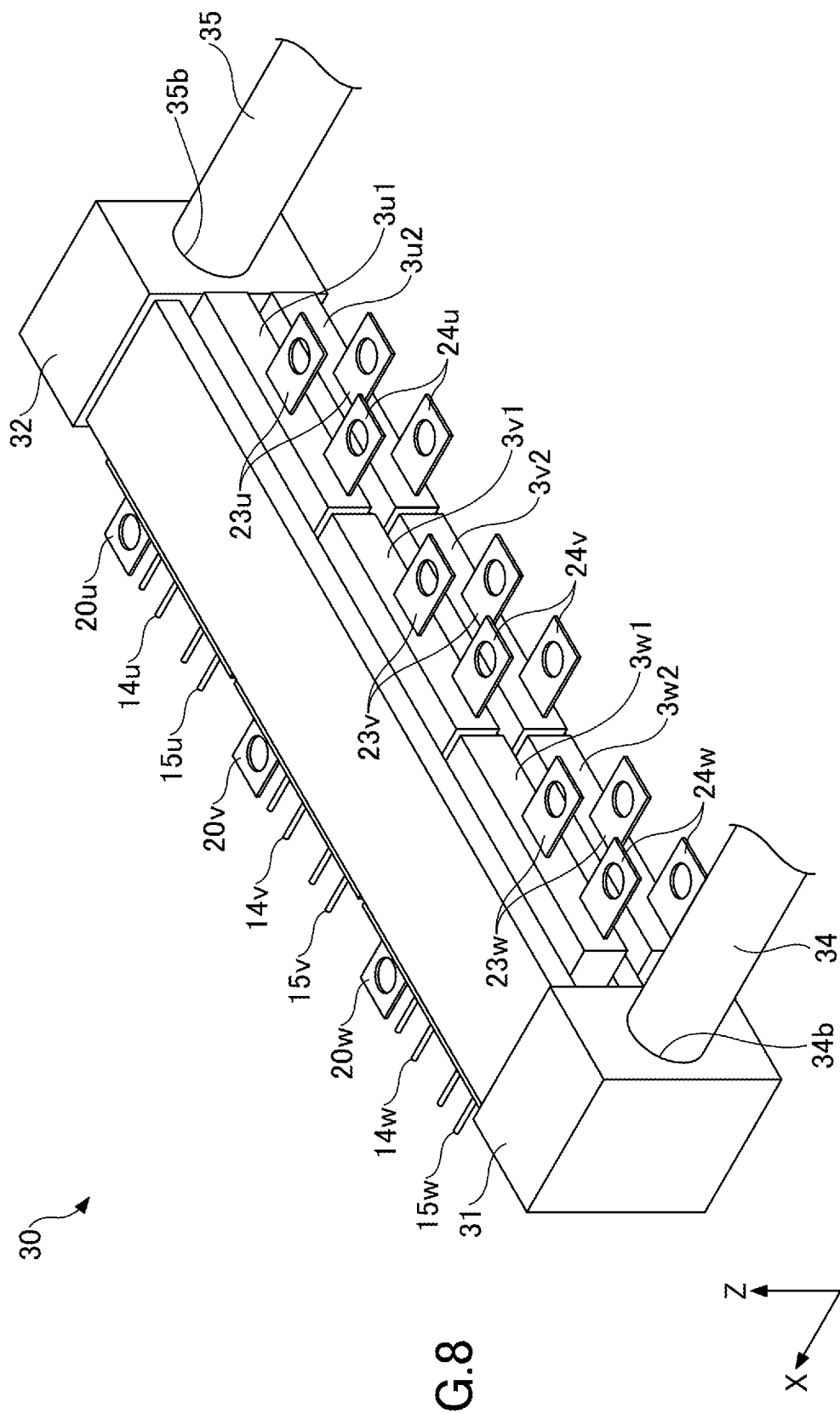
FIG. 8 is a perspective view of a first coupling configuration of a supply tube, a discharge tube, and a cooler.
Figure 9:
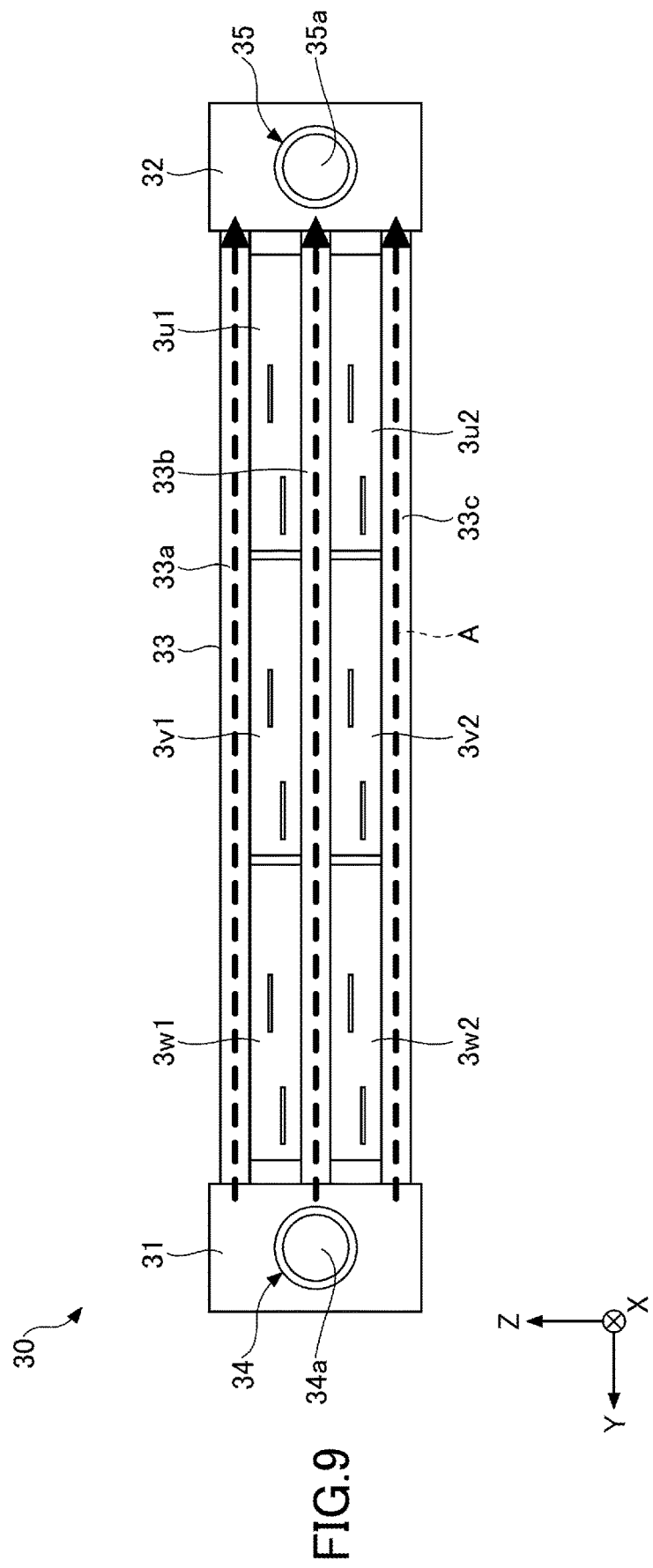
FIG. 9 is a front view of an example of the configuration of the cooler coupled in the first coupling configuration.

FIG. 8 is a perspective view of a first coupling configuration of the supply tube, the discharge tube, and the cooler. FIG. 9 is a front view of an example of the configuration of the cooler coupled in the first coupling configuration. The first coupling configuration can be applied to the cooler 30 illustrated in each of FIGS. 4, 5, and 6 (in FIG. 4, the coolant supply port 34b coupled to the supply tube 34 and the coolant discharge port 35b coupled to the discharge tube 35 may be reversed).

The cooler 30 illustrated in FIGS. 8 and 9 includes the coolant supply port 34b coupled to the supply tube 34, the first header 31 coupled to the coolant supply port 34b, and the coolant discharge port 35b coupled to the discharge tube 35. The cooler 30 also includes the second header 32 coupled to the coolant discharge port 35b and includes the cooling tube 33 connected between the first header 31 and the second header 32. The cooling tube 33 has a plurality of flow paths 33a, 33b, and 33c that are ranged in the Z-axis direction. The first header 31 distributes the coolant A flowing in from the supply tube 34 equally among the flow paths 33a, 33b, and 33c, and each of the flow paths 33a, 33b, and 33c discharges the coolant A into the second header 32. The second header 32 causes coolants A flowing out from the respective flow paths 33a, 33b, and 33c, to be met, and discharges the coolant A into the discharge tube 35.

A given module, among the six modules 3 (3u1, 3u2, 3v1, 3v1, 3v2, 3w1, and 3w2), that incorporates a given high-side switching element among the high-side switching elements 21u, 21v, and 21w and a given low-side switching element among the low-side switching elements 22u, 22v, and 22w, is interposed, in the Z-axis direction, between given flow paths among the flow paths 33a, 33b, and 33c. Three modules 3u1, 3v1, and 3w1 are each interposed between the flow path 33a and the flow path 33b, and three modules 3u2, 3v2, and 3w2 are each interposed between the flow path 33b and the flow path 33c. With such an interposed structure, heat of the high-side switching elements 21u, 21v, and 21w and the low-side switching elements 22u, 22v, and 22w is cooled (heat exchanged) by the coolant A passing through the flow paths 33a, 33b, and 33c, thereby increasing the cooling effect.

Figure 14:
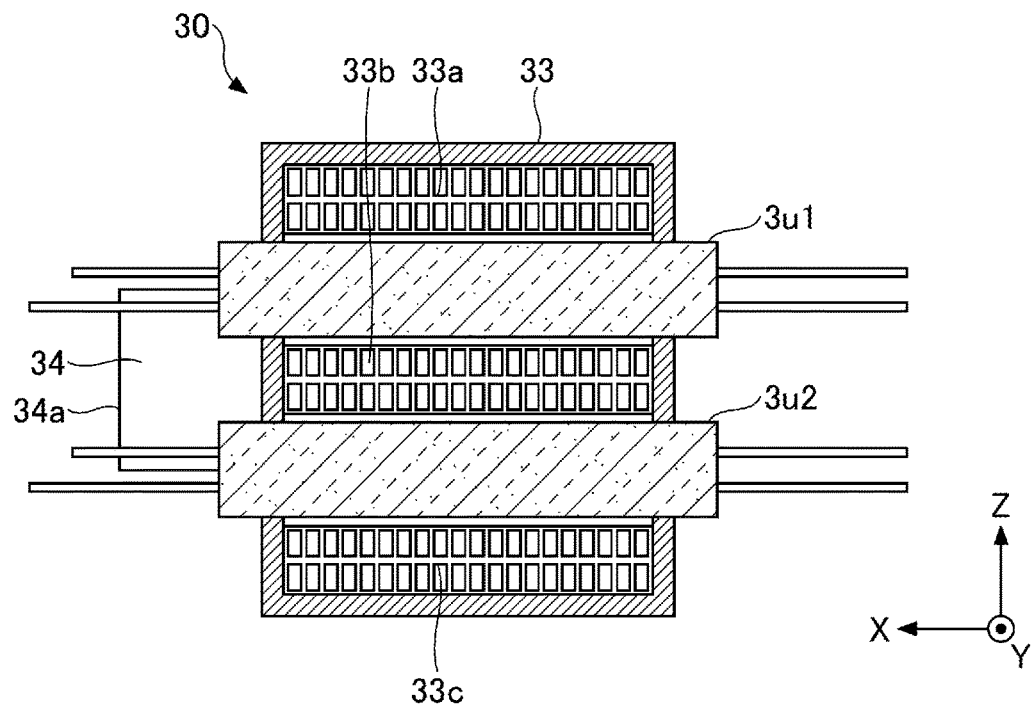
FIG. 14 is a cross-sectional view of an example of a microchannel structure of the cooler.

FIG. 14 is a cross-sectional view of the microchannel structure of the cooler. As illustrated in FIG. 14, each of the multiple flow paths 33a, 33b, and 33c may employ a microchannel structure in order to increase the cooling effect.

Figure 10:
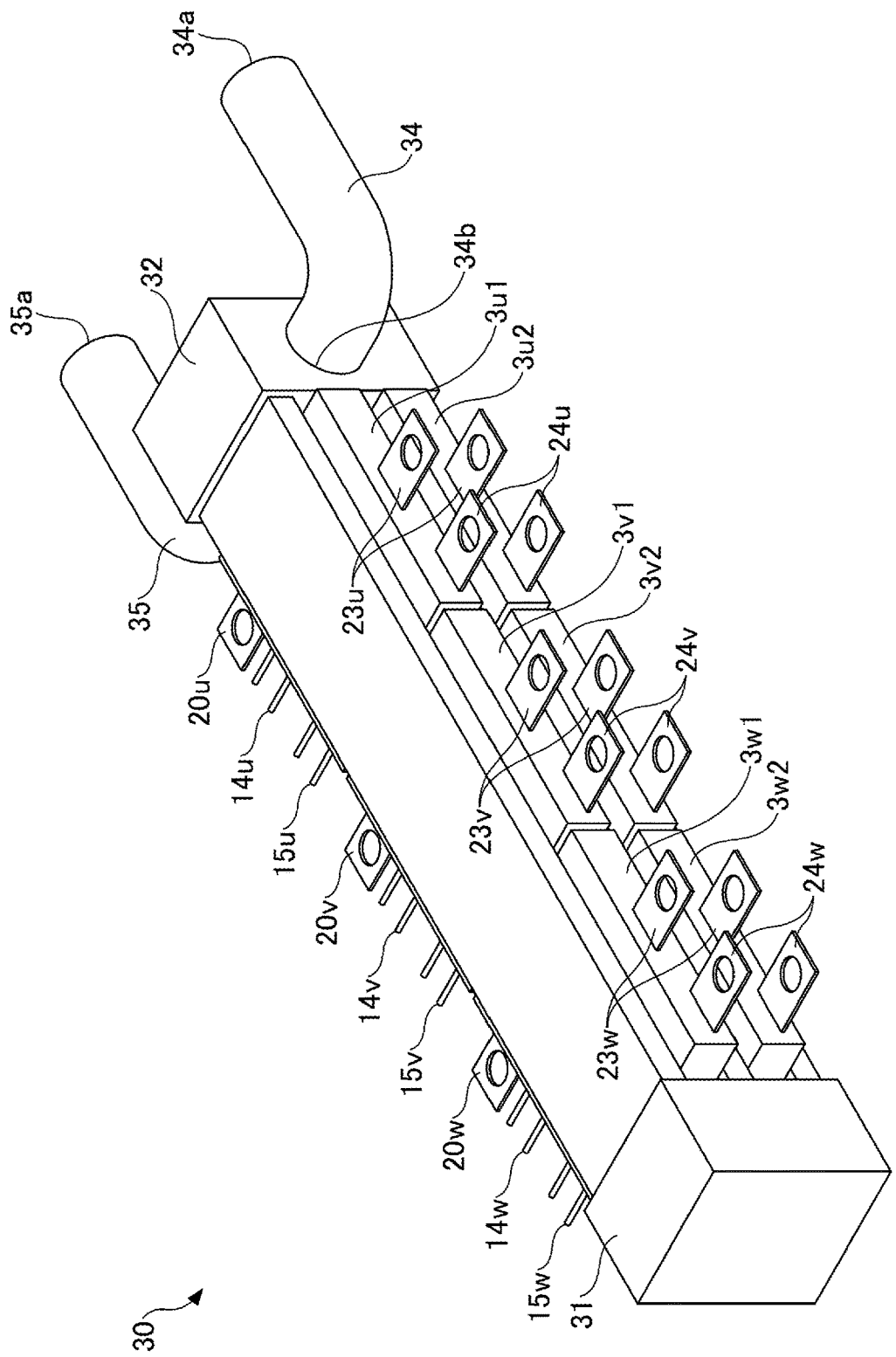
FIG. 10 is a perspective view of a second coupling configuration of the supply tube, the discharge tube, and the cooler.
Figure 11:
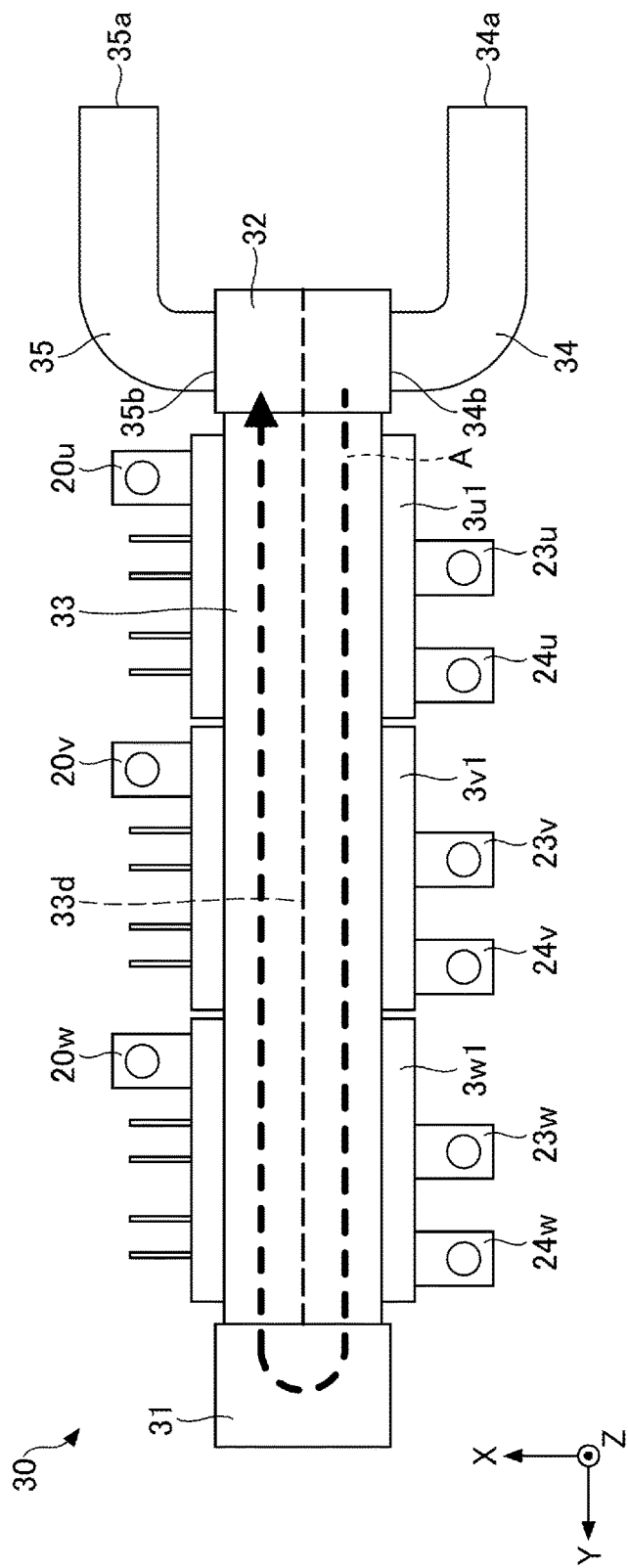
FIG. 11 is a plan view of an example of a first configuration of the cooler coupled in the second coupling configuration.

FIG. 10 is a perspective view of a second coupling configuration of the supply tube, the discharge tube, and the cooler. FIG. 11 is a plan view of an example of a first configuration of the cooler coupled in the second coupling configuration. The second coupling configuration can be applied to the cooler 30 illustrated in FIG. 7.

As in the first coupling configuration, in the first configuration (FIG. 11) of the cooler 30 (FIG. 10), as coupled in the second coupling configuration, the cooling tube 33 has flow paths 33a, 33b, and 33c ranged in the Z-axis direction. In the example of the first configuration (FIG. 11), the second header 32 and the flow paths 33a, 33b, and 33c each have a partition 33d. The second header 32 distributes the coolant A flowing in from the supply tube 34 equally among the flow paths 33a, 33b, and 33c that are in the negative X-axis direction with respect to partitions 33d, and then the coolant A is discharged into the first header 31. The first header 31 directs the coolant A to the flow paths 33a, 33b, and 33c that are in the positive X-axis direction with respect to the partitions 33d, and then the coolant A is discharged into the discharge tube 35, through the second header 32.

In the example of the first configuration (FIG. 11), the interposed structure is included as in the first coupling connection. With this arrangement, heat of the high-side switching elements 21u, 21v, and 21w and the low-side switching elements 22u, 22v, and 22w is cooled (heat exchanged) by the coolant A passing through the flow paths 33a, 33b, and 33c, thereby improving the cooling effect.

Figure 15:
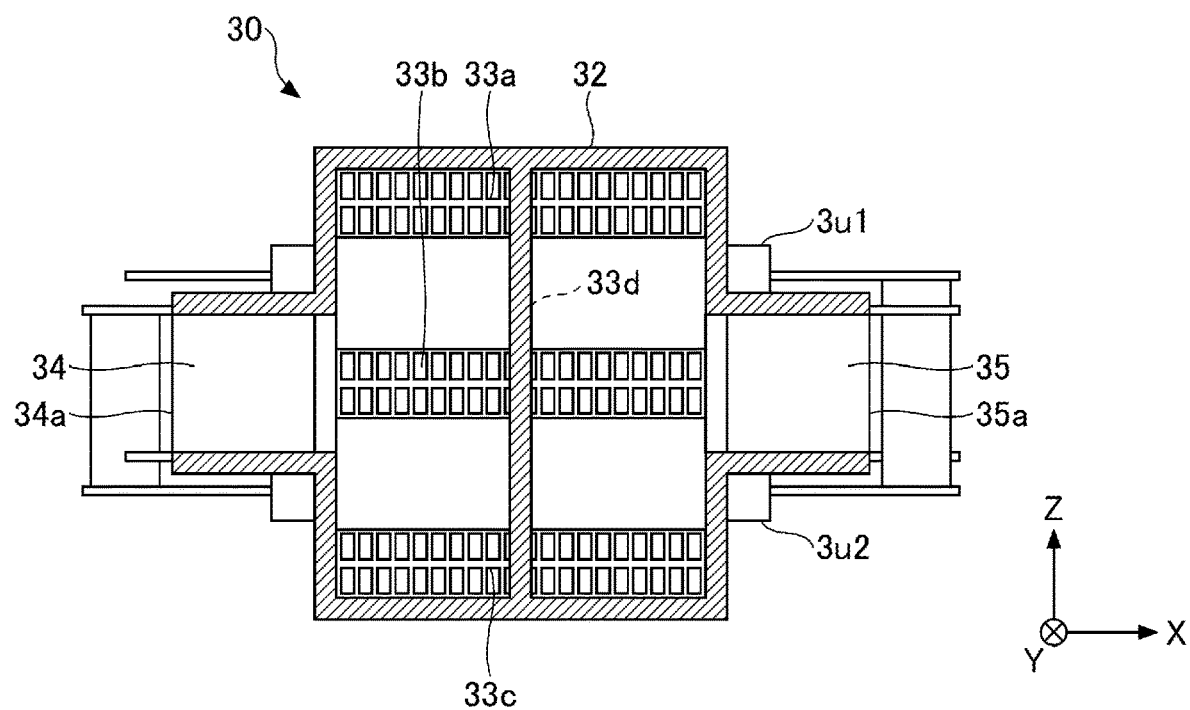
FIG. 15 is a cross-sectional view of the microchannel structure of the first configuration of the cooler coupled in the second coupling configuration.

FIG. 15 is a cross-sectional view of the microchannel structure of the first configuration (FIG. 11) of the cooler coupled in the second coupling configuration. As illustrated in FIG. 15, each of multiple flow paths 33a, 33b, and 33c may employ a microchannel structure in order to increase the cooling effect. When each of the flow paths 33a, 33b, and 33c has the microchannel structure, the flow paths 33a, 33b, and 33c may not have any partition. Any partition may be provided only in the second header 32.

Figure 12:
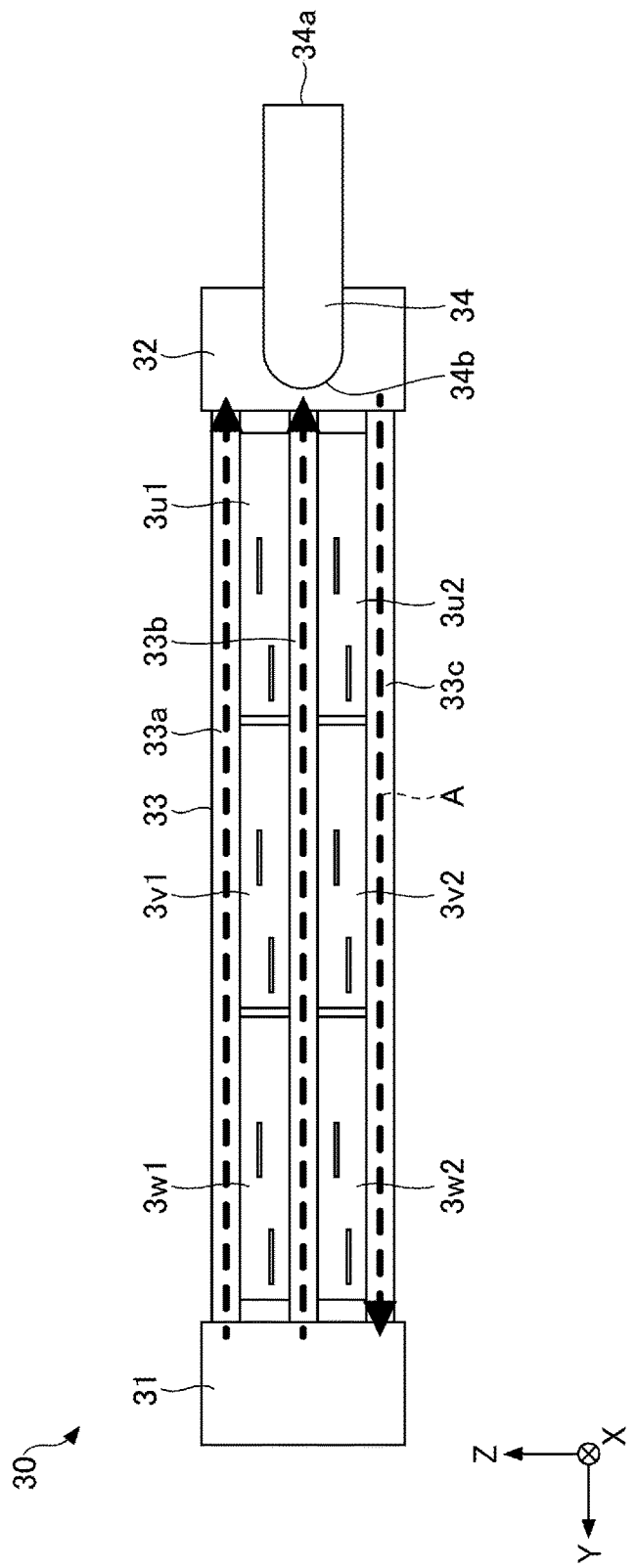
FIG. 12 is a front view of an example of a second configuration of the cooler coupled in the second coupling configuration.
Figure 13:
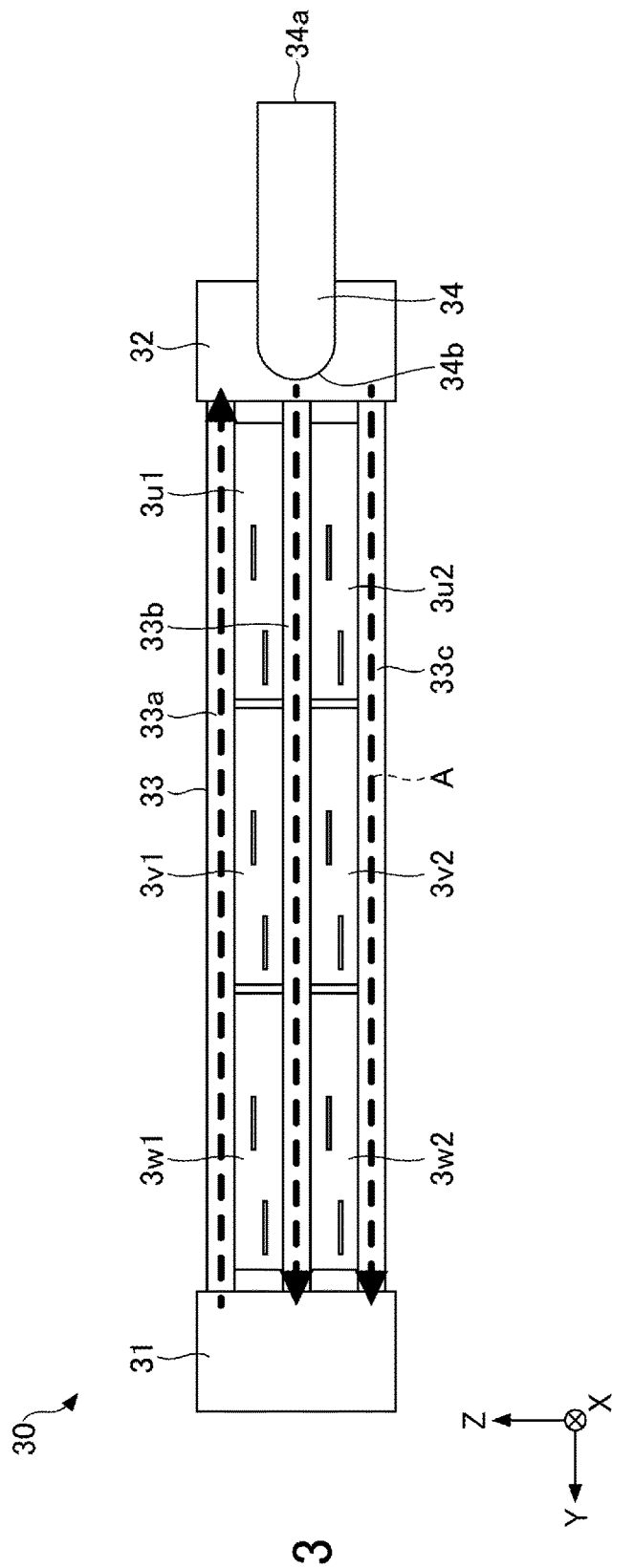
FIG. 13 is a front view of an example of a third configuration of the cooler coupled in the second coupling configuration.

FIG. 12 is a front view of an example of a second configuration of the cooler coupled in the second coupling configuration. FIG. 13 is a front view of an example of a third configuration of the cooler coupled in the second coupling configuration. As in the first coupling configuration, in the example of the second configuration (FIG. 12) and the example of third configuration (FIG. 13), the cooling tube 33 has multiple flow paths 33a, 33b, and 33c ranged in the Z-axis direction. In the example of the second configuration (FIG. 12), the second header 32 has a partition for supplying the coolant A flowing in from the supply tube 34, to the flow path 33c without supplying the coolant to the flow paths 33a and 33b. In the example of the third configuration (FIG. 13), the second header 32 has a partition for supplying the coolant A flowing in from the supply tube 34, to the flow paths 33b and 33c without supplying the coolant to the flow path 33a.

In each of the example of the second configuration (FIG. 12) and the example of the third configuration (FIG. 13), the interposed structure is included as in the first coupling configuration. With this arrangement, heat of the high-side switching elements 21u, 21v, and 21w and the low-side switching elements 22u, 22v, and 22w is cooled (heat exchanged) by the coolant A passing through the flow paths 33a, 33b, and 33c, thereby increasing the cooling effect.

Figure 16:
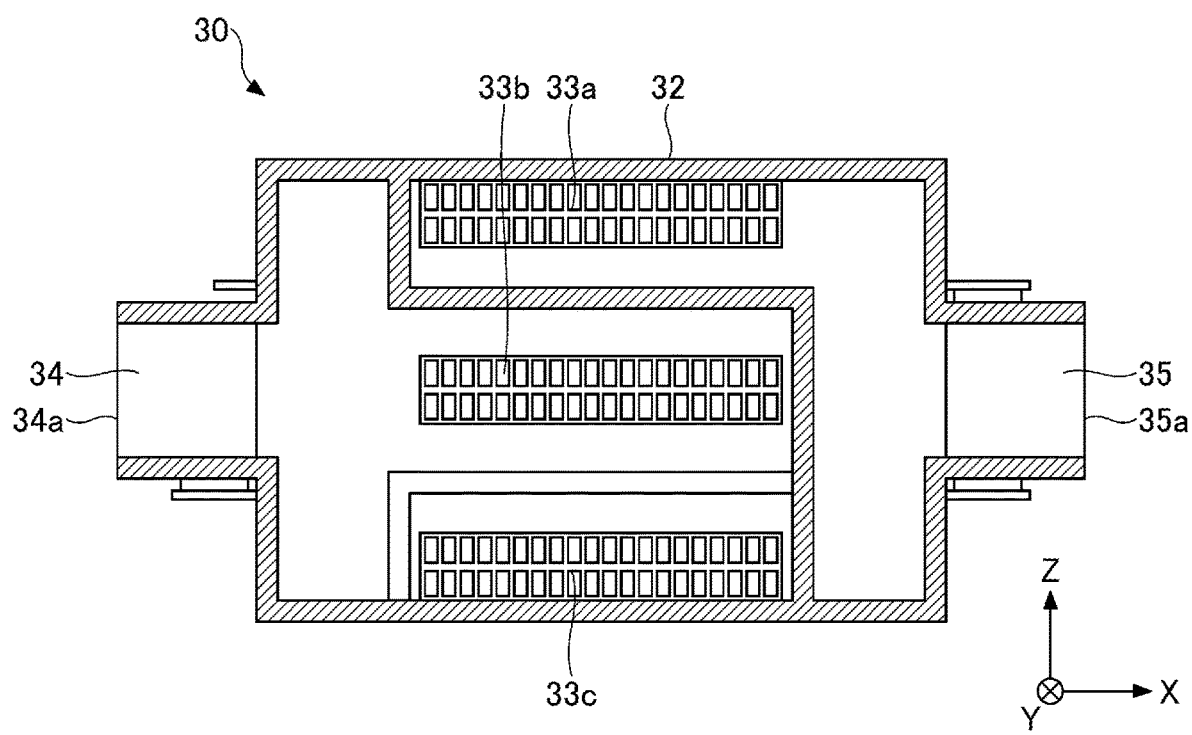
FIG. 16 is a cross-sectional view of the microchannel structure of the third configuration of the cooler coupled in the second coupling configuration.

FIG. 16 is a cross-sectional view of the microchannel structure of the example of the third configuration of the cooler coupled in the second coupling configuration. As illustrated in FIG. 16, each of multiple flow paths 33a, 33b, and 33c may employ a microchannel structure in order to increase the cooling effect.

By employing the interposed structure illustrated in FIGS. 8 to 16, six modules 3u1, 3u2, 3v1, 3v1, 3v2, 3w1, 3w2, and 3w2 each of which incorporates a given switching element, among the switching elements 21u, 21v, 21w, 22u, 22v, and 22w, are isolated from the supply tube 34 and the discharge tube 35. With this arrangement, even when the tube routing of the supply tube 34 and the discharge tube 35 is changed, it is less likely to reposition the six modules 3u1, 3u2, 3v1, 3v1, 3v2, 3w1, 3w1, and 3w2 each of which incorporates a given switching element among the switching elements 21u, 21v, 21w, 22u, 22v, and 22w.

As illustrated in FIG. 3, the housing 4 has the housing surface 4e. The housing surface 4e is an example of a fourth housing surface. A portion (in this example, the second positive bar 81p) of at least one among the positive busbar 83 and the negative busbar 93 passes, in the Y-axis direction, between the cooler 30 and the housing surface 4e. The second positive bar 81p passes between the cooler 30 and the housing surface 4e, and thus the second positive bar 81p is unlikely to be influenced by changes in the tube routing of the supply tube 34 and the discharge tube 35. Thus, the layout change of the second positive bar 81p is unlikely to occur.

The cooler 30 is a member separated from the housing 4. With this arrangement, it is easy to reposition the inlet port 34a and outlet port 35a that are respectively connected to the cooler 30 via the supply tube 34 and discharge tube 35, in comparison to a configuration (for example, a configuration in which the cooler and the housing are integrally formed by die casting) in which a component having the same function as that of the cooler 30 is the same member as the housing.

Although the power converter has been described according to the embodiments, the present invention is not limited to the embodiments described above. Various changes and modifications, such as combinations and substitutions with some or all of the other embodiments, can be made within the scope of the present invention.

For example, the open spaces 53, and 54 may be coplanar (e.g., the same XY plane) with the supply tube 34 and the discharge tube 35.

The inlet port 34a is portion of the supply tube 34, but may be a member separated from the supply tube 34. The outlet port 35a is a portion of the discharge tube 35, but may be a member separated from the discharge tube 35.

For example, the power converter in the present disclosure is not limited to an inverter that generates a three-phase alternating current, and may be an inverter that generates an alternating current other than the three-phase alternating current.

The power converter in the present disclosure is not limited to an inverter that converts DC into AC, and may be a converter that converts DC into DC. A specific example of such a power converter includes a boost voltage converter that boosts an input voltage and outputs the boosted voltage, a buck voltage converter that steps down an input voltage and outputs a lowered voltage, or a boost and buck converter that boosts or steps down an input voltage and outputs it.

Aspect 1

A power converter comprising:
a positive terminal;
a negative terminal;
multiple output terminals;
a capacitor including a first capacitor electrode and a second capacitor electrode;
a plurality of high-side switching elements each including a first main electrode and a second main electrode;
a plurality of low-side switching elements each including a third main electrode and a fourth main electrode;
a positive busbar electrically connected to the positive terminal, the first capacitor electrode, and first main electrodes;
a negative busbar electrically connected to the negative terminal, the second capacitor electrode, and fourth main electrodes;
a plurality of output busbars electrically connected to the multiple output terminals, second main electrodes, and third main electrodes, respectively;
a cooler for cooling the plurality of high-side switching elements and the plurality of low-side switching elements;
an inlet port into which a coolant flows;
an outlet port from which the coolant flows out;
a supply tube for supplying the coolant flowing from the inlet port to the cooler;
a discharge tube for discharging the coolant flowing out from the cooler, into the outlet port; and
a housing that accommodates
the capacitor,
the plurality of high-side switching elements,
the plurality of low-side switching elements,
the positive busbar,
the negative busbar,
the plurality of output busbars,
the cooler,
the supply tube, and
the discharge tube,
wherein the positive terminal, the negative terminal, the multiple output terminals, the inlet port, and the outlet port are exposed from the housing, and
wherein the inlet port, the outlet port, the supply tube, and the discharge tube are separate members from the housing.

Aspect 2

The power converter according to aspect 1, wherein the housing includes
a first housing surface on which at least one among the inlet port and the output port is exposed, and
a second housing surface facing or adjacent to the first housing surface,
wherein the cooler has a coupling point where at least one among the supply tube and the discharge tube is coupled, and
wherein an open space is provided between the second housing surface and the coupling point.

Aspect 3

The power converter according to aspect 2, wherein the open space is on a side of the coupling point opposite the supply tube or the discharge tube that is located.

Aspect 4

The power converter according to aspect 3, wherein the open space is coplanar with the supply tube or the discharge tube.

Aspect 5

The power converter according to aspect 2, wherein the housing has a third housing surface adjacent to the second housing surface, and
wherein the open space is provided at a location surrounded by the third housing surface, the second housing surface, and the coupling point.

Aspect 6

The power converter according to aspect, wherein the open space is partitioned by the capacitor.

Aspect 7

The power converter according to aspect 6, wherein the open space is partitioned by a step formed in the capacitor.

Aspect 8

The power converter according to aspect 1, wherein the positive busbar includes a first positive busbar that is electrically connected between the positive terminal and the first capacitor electrode, and a second positive electrode that is electrically connected between the first capacitor electrode and each first main electrode.

Aspect 9

The power converter according to aspect 8, wherein at least a portion of the second positive busbar is covered by the capacitor.

Aspect 10

The power converter according to aspect 1, wherein the negative busbar includes a first negative busbar that is electrically connected between the negative terminal and the second capacitor electrode, and a second negative electrode that is electrically connected between the second capacitor electrode and each fourth main electrode.

Aspect 11

The power converter according to aspect 10, wherein at least a portion of the second negative busbar is covered by the capacitor.

Aspect 12

The power converter according to aspect 1, wherein the cooler includes a coolant supply port coupled to the supply tube, a coolant discharge port coupled to the discharge tube, and a plurality of flow paths connected between the coolant supply port and the coolant discharge port, and wherein a given high-side switching element from among the plurality of high-side switching elements, and a given low-side switching element from among the plurality of low-side switching elements are interposed between given flow paths.

Aspect 13

The power converter according to aspect 1, wherein the housing includes a first housing surface from which at least one among the inlet port and the outlet port is exposed, a second housing surface facing the first housing surface, a third housing surface adjacent to the first housing surface and the second housing surface, and a fourth housing surface adjacent to the first housing surface, the second housing surface, and the third housing surface, and wherein a portion of at least one among the positive busbar and the negative busbar passes between the cooler and the fourth housing surface.

Aspect 14

The power converter according to aspect 1, wherein the cooler is a separate member from the housing.

What is claimed is:

1. A power converter comprising:
a positive terminal;
a negative terminal;
multiple output terminals;
a capacitor including a first capacitor electrode and a second capacitor electrode;
a plurality of high-side switching elements each including a first main electrode and a second main electrode;
a plurality of low-side switching elements each including a third main electrode and a fourth main electrode;
a positive busbar electrically connected to the positive terminal, the first capacitor electrode, and first main electrodes;
a negative busbar electrically connected to the negative terminal, the second capacitor electrode, and fourth main electrodes;
a plurality of output busbars electrically connected to the multiple output terminals, second main electrodes, and third main electrodes, respectively;
a cooler for cooling the plurality of high-side switching elements and the plurality of low-side switching elements;
an inlet port into which a coolant flows;
an outlet port from which the coolant flows out;
a supply tube for supplying the coolant flowing from the inlet port to the cooler;
a discharge tube for discharging the coolant flowing out from the cooler, into the outlet port; and
a housing that accommodates
the capacitor,
the plurality of high-side switching elements,
the plurality of low-side switching elements,
the positive busbar,
the negative busbar,
the plurality of output busbars,
the cooler,
the supply tube, and
the discharge tube,
wherein the positive terminal, the negative terminal, the plurality of output terminals, the inlet port, and the outlet port are exposed from the housing,
wherein the housing includes
a first surface on which the multiple output terminals are exposed,
a second surface facing the first surface,
a third surface adjacent to the first surface and the second surface, and
a fourth surface facing the third surface,
wherein the plurality of output busbars are located between the first surface and the cooler,
wherein the cooler is located between the capacitor and the output busbars,
wherein the capacitor is located between the second surface and the cooler,
wherein the cooler includes
a cooling tube extending in a first direction in which the third surface and the fourth surface face each other,
a first end in one side in the first direction, and
a second end in another side in the first direction,
wherein the supply tube and the discharge tube are disposed in at least one space among a space between the first surface and the first end, a space between the first surface and the second end, a space between the second surface and the first end, and a space between the second surface and the second end,
wherein the positive terminal, the negative terminal, the multiple output terminals, the inlet port, and the outlet port are exposed from the housing, and wherein the inlet port, the outlet port, the supply tube, and the discharge tube are separate members from the housing.

2. The power converter according to claim 1, wherein the first end is a first header that is attached to an end of the cooling tube on the one side and to which the supply tube is coupled, and
wherein the second end is a second header that is attached to an end of the cooling tube on the another side and to which the discharge tube is coupled.

3. The power converter according to claim 2, wherein the supply tube is disposed between either the first surface or the second surface and the first header, and
wherein the discharge tube is disposed between either the first surface or the second surface and the second header.

4. The power converter according to claim 3, wherein a first open space is provided on a side of the first header opposite a side of the supply tube being located, and
wherein a second empty space is provided on a side of the second header opposite a side of the discharge tube being located.

5. The power converter according to claim 4, wherein the first open space is coplanar with the supply tube, and
wherein the second open space is coplanar with the discharge tube.

6. The power converter according to claim 4, wherein the first open space is partitioned by the capacitor.

7. The power converter according to claim 6, wherein the first open space is partitioned by a step formed in the capacitor.

8. The power converter according to claim 2, the first header is configured to supply the coolant flowing in from the supply tube, to the cooling tube, and
wherein the second header is configured to discharge the coolant flowing out from the cooling tube, into the discharge tube.

9. The power converter according to claim 1, wherein the first end is a first header attached to an end of the cooling tube on the another side, and
wherein the second end is a second header that is attached to an end of the cooling tube on the another side and to which the supply tube and the discharge tube are coupled.

10. The power converter according to claim 9, wherein the supply tube is disposed between the second surface and the second header, and
wherein the discharge tube is disposed between the first surface and the second header.

11. The power converter according to claim 10, wherein a first open space is provided between the first header and the second surface, and
wherein a second open space is provided between the first header and the first surface.

12. The power converter according to claim 9, wherein the second header is configured to supply the coolant flowing in from the supply tube, to a first flow path in the cooling tube,
wherein the first header is configured to supply the coolant flowing out from the first flow path, to a second flow path in the cooling tube, and
wherein the second header is configured to discharge the coolant flowing out from the second flow path, into the discharge tube.

13. The power converter according to claim 1, wherein the positive terminal and the negative terminal are exposed from the first surface.

14. The power converter according to claim 1, wherein the positive busbar includes
a first positive busbar electrically connected between the positive terminal and the first capacitor electrode, and
a second positive busbar electrically connected between the first capacitor electrode and each first main electrode.

15. The power converter according to claim 14, wherein at least a portion of the second positive busbar is covered by the capacitor.

16. The power converter according to claim 1, wherein the negative busbar includes
a first negative busbar electrically connected between the negative terminal and the second capacitor electrode, and
a second negative busbar electrically connected between the second capacitor electrode and each fourth main electrode.

17. The power converter according to claim 16, wherein at least a portion of the second negative busbar is covered by the capacitor.

18. The power converter according to claim 1, wherein the cooler includes
a coolant supply port coupled to the supply tube,
a coolant discharge port coupled to the discharge tube, and
a plurality of flow paths connected between the coolant supply port and the coolant discharge port, and
wherein given switching elements among the plurality of high-side switching elements and the plurality of low-side switching elements are interposed between given flow paths.

19. The power converter according to claim 1, wherein the housing includes a fifth surface adjacent to the first surface, the second surface, and the third surface, and
wherein a portion of at least one among the positive busbar and the negative busbar passes between the cooler and the fifth surface.

20. The power converter according to claim 1, wherein the cooler is a separate member from the housing.

* * * * *